(12) United States Patent
Mao et al.

(10) Patent No.: US 10,763,143 B2
(45) Date of Patent: Sep. 1, 2020

(54) PROCESSING TOOL HAVING A MONITORING DEVICE

(71) Applicant: APPLIED MATERIALS, INC., Santa Clara, CA (US)

(72) Inventors: Shimin Mao, Union City, CA (US); Simon Huang, Campbell, CA (US); Ashish Goel, Sunnyvale, CA (US); Anantha Subramani, San Jose, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/681,263

(22) Filed: Aug. 18, 2017

(65) Prior Publication Data
US 2019/0057889 A1 Feb. 21, 2019

(51) Int. Cl.
*B05C 11/00* (2006.01)
*B05C 13/00* (2006.01)
(Continued)

(52) U.S. Cl.
CPC ...... *H01L 21/67253* (2013.01); *C23C 14/543* (2013.01); *C23C 16/52* (2013.01); *H01L 21/6719* (2013.01); *H01L 21/67069* (2013.01)

(58) Field of Classification Search
CPC ..... C23C 14/50; C23C 14/543; C23C 14/243; C23C 14/545; H01L 51/001; H01L 51/56
See application file for complete search history.

(56) References Cited

U.S. PATENT DOCUMENTS 4,362,125 A * 12/1982 Schadler ............ G01B 17/025
118/664
5,025,661 A * 6/1991 McCormack ....... G01L 19/0007
73/180
(Continued)

FOREIGN PATENT DOCUMENTS

JP 2009-252945 A 10/2009
KR 10-2004-0053592 A 6/2004
(Continued)

OTHER PUBLICATIONS

KR20140136159A_Original_document with machine translation (Year: 2014).*
(Continued)

*Primary Examiner* — Brian Turner
(74) *Attorney, Agent, or Firm* — Schwabe, Williamson & Wyatt, P.C.

(57) ABSTRACT

Embodiments include systems, devices, and methods for monitoring etch or deposition rates, or controlling an operation of a wafer fabrication process. In an embodiment, a processing tool includes a processing chamber having a liner wall around a chamber volume, and a monitoring device having a sensor exposed to the chamber volume through a hole in the liner wall. The sensor is capable of measuring, in real-time, material deposition and removal rates occurring within the chamber volume during the wafer fabrication process. The monitoring device can be moved relative to the hole in the liner wall to selectively expose either the sensor or a blank area to the chamber volume through the hole. Accordingly, the wafer fabrication process being performed in the chamber volume may be monitored by the sensor, and the sensor may be sealed off from the chamber volume during an in-situ chamber cleaning process. Other embodiments are also described and claimed.

20 Claims, 12 Drawing Sheets

(51) Int. Cl.
*C23C 16/52* (2006.01)
*C23C 14/54* (2006.01)
*H01L 21/67* (2006.01)

(56) References Cited

U.S. PATENT DOCUMENTS

| | | |
|---|---|---|
| 5,025,664 A | 6/1991 | Kendrick et al. |
| 5,282,925 A | 2/1994 | Jeng et al. |
| 5,706,840 A * | 1/1998 | Schneider ............... B08B 3/00 |
| | | 134/104.2 |
| 5,885,402 A * | 3/1999 | Esquibel ............ H01J 37/32935 |
| | | 156/345.24 |
| 5,948,983 A * | 9/1999 | Gogol, Jr. ............ C23C 16/4405 |
| | | 118/664 |
| 6,558,735 B2 * | 5/2003 | Marcus ................... C23C 14/12 |
| | | 118/664 |
| 6,614,050 B1 | 9/2003 | Yamada |
| 6,654,659 B1 | 11/2003 | Lyons et al. |
| 6,696,362 B2 | 2/2004 | Rossman et al. |
| 7,032,876 B1 * | 4/2006 | Pedersen ................. F16K 7/02 |
| | | 251/331 |
| 7,052,622 B2 | 5/2006 | Chinn et al. |
| 7,159,599 B2 | 1/2007 | Verhaverbeke |
| 7,166,480 B2 | 1/2007 | Shiraishi et al. |
| 7,521,915 B2 | 4/2009 | Herchen et al. |
| 7,567,072 B2 | 7/2009 | Orvek et al. |
| 8,823,933 B2 | 9/2014 | Bonciolini et al. |
| 9,567,661 B2 | 2/2017 | Ruby et al. |
| 9,725,302 B1 | 8/2017 | Tedeschi et al. |
| 2002/0189542 A1 * | 12/2002 | Van Slyke ............... C23C 14/12 |
| | | 118/712 |
| 2006/0216406 A1 * | 9/2006 | Hudson ............. H01J 37/32935 |
| | | 427/8 |
| 2007/0125303 A1 * | 6/2007 | Ruby ................... C23C 14/0021 |
| | | 118/724 |
| 2010/0187094 A1 | 7/2010 | Fukao |
| 2012/0185813 A1 | 7/2012 | Kaushal |
| 2014/0053779 A1 * | 2/2014 | Martinson ......... C23C 16/45525 |
| | | 118/723 R |
| 2014/0167757 A1 * | 6/2014 | Laskaris ................... H02G 3/22 |
| | | 324/322 |
| 2014/0312713 A1 * | 10/2014 | Wentzler ................ H01H 35/32 |
| | | 307/118 |
| 2015/0079274 A1 * | 3/2015 | Kakiuchi ................ C23C 14/50 |
| | | 427/9 |
| 2015/0082865 A1 * | 3/2015 | Ozaki .................. G01N 29/036 |
| | | 73/24.06 |
| 2015/0266021 A1 * | 9/2015 | Eckman .................. B05C 5/027 |
| | | 427/261 |
| 2017/0141001 A1 | 5/2017 | Sakiyama et al. |

FOREIGN PATENT DOCUMENTS

| | | | |
|---|---|---|---|
| KR | 10-2008-0045974 A | | 5/2008 |
| KR | 10-1340425 B1 | | 12/2013 |
| KR | 20140136159 A | * | 11/2014 |
| KR | 10-2017-0094040 A | | 8/2017 |
| WO | WO 2015-182090 A1 | | 12/2015 |

OTHER PUBLICATIONS

PCT International Search Report and Written Opinion for PCT International Appln No. PCT/US2017/014176 dated Apr. 21, 2017. (13 pages).
U.S. Appl. No. 15/068,464, filed Mar. 11, 2016, titled "Wafer Processing Tool Having a Micro Sensor", by inventor Leonard Tedeschi, 66 pages (filing documents, specification and drawings).
U.S. Appl. No. 15/009,705, filed Jan. 28, 2016, titled "Real Time Process Characterization", by inventors Leonard Tedeschi and Kartik Ramaswamy, 76 pages (filing documents, specification and drawings).
Harash Ajjam, "Individual Air-Borne Particle Mass Measurement Using High-Frequency Micromechanical Resonators", IEEE Sensors Journal , vol. 11, No. 11, Nov. 2011, pp. 2883-2890.
U.S. Appl. No. 15/247,717, filed Aug. 25, 2016, titled "Wafer Processing Equipment Having Exposable Sensing Layers", by inventors Leonard Tedeschi, Lili Ji, Olivier Joubert, Dmitry Lubomirsky, Philip Allan Kraus, and Daniel T. McCormick , 79 pages (specification and drawings).
U.S. Appl. No. 15/351,437, filed Nov. 14, 2016, titled "Selective Etch Rate Monitor", by inventors Philip Allan Kraus and Timothy J. Franklin , 43 pages (specification and drawings).
International Search Report and Written Opinion from PCT/US2018/042537 dated Nov. 2, 2018, 9 pgs.
International Preliminary Report on Patentability from Application No. PCT/US2018/042537 dated Feb. 27, 2020, 6 pgs.

* cited by examiner

PROCESSING TOOL HAVING A MONITORING DEVICE

BACKGROUND

1) Field

Embodiments relate to the field of substrate processing and, in particular, to devices and methods for measuring material deposition or material removal in a processing tool.

2) Description of Related Art

The manufacture of semiconductor devices can involve the deposition and removal of material, and more particularly semiconductor material, on a substrate by a wafer processing tool using, e.g., deposition or etching processes. Etching processes include traditional reactive-ion etching (RIE) and radicals-based selective removal processes (SRPs), and their combinations. Deposition processes include thermal chemical vapor deposition (CVD) and plasma-enhanced CVD processes. To accurately deposit or remove a specified amount of semiconductor material, film thickness measurement techniques may be used. For example, material deposition and material removal rates may be indirectly measured by processing a wafer of semiconductor material for a given amount of time, and then measuring an amount of film deposited or removed using an ellipsometer. Furthermore, sensors have been used to measure secondary factors that correlate with deposition/removal rates to indirectly estimate deposition/removal rates during a wafer fabrication process.

SUMMARY

Embodiments include processing equipment having sensors to detect an amount or rate of material deposition or removal. In an embodiment, the processing equipment includes a processing tool including a process chamber having a liner wall around a chamber volume. The liner wall includes a hole between the chamber volume and an outer liner surface. The processing tool includes a monitoring device having a sensor, and the sensor includes a sensor surface aligned with the hole along a sensor axis. Furthermore, the sensor includes a parameter that changes when material is removed from the sensor surface. Accordingly, the monitoring device can monitor a wafer fabrication process by determining process characteristics based on the changing parameter.

In an embodiment, the monitoring device includes a device body extending along a central axis. The device body includes an end face orthogonal to the central axis, and the end face includes a recess. The sensor is mounted in the recess. Furthermore, a sensor seal is mounted on the end face and extends around the recess. The sensor surface is exposed to a surrounding environment through the sensor seal. Accordingly, the sensor seal can be compressed between the end face and the liner wall around the hole to expose the sensor to the chamber volume. Alternatively, the sensor seal can be compressed between the end face and the liner wall at a location laterally offset from the hole to isolate the sensor from the chamber volume.

In an embodiment, a method includes loading a wafer of a material into the chamber volume of the processing tool. The method includes initiating a wafer fabrication process in the chamber volume. The material can be removed from the sensor surface through the hole during the wafer fabrication process. The method includes detecting the change of the parameter of the sensor in response to removing the material from the sensor surface. A rate of removal of the material from the sensor surface may be determined based on the change of the parameter. The method can include exposing a blank area of the end face to the hole, and initiating an in-situ chamber cleaning process to clean the liner wall. Accordingly, the sensor can be exposed to the hole to monitor the wafer fabrication process, e.g., a selective removal process, and be isolated from the hole during an in-situ chamber cleaning process.

The above summary does not include an exhaustive list of all aspects. It is contemplated that all systems and methods are included that can be practiced from all suitable combinations of the various aspects summarized above, as well as those disclosed in the Detailed Description below and particularly pointed out in the claims filed with the application. Such combinations have particular advantages not specifically recited in the above summary.

DETAILED DESCRIPTION

Figure 1:
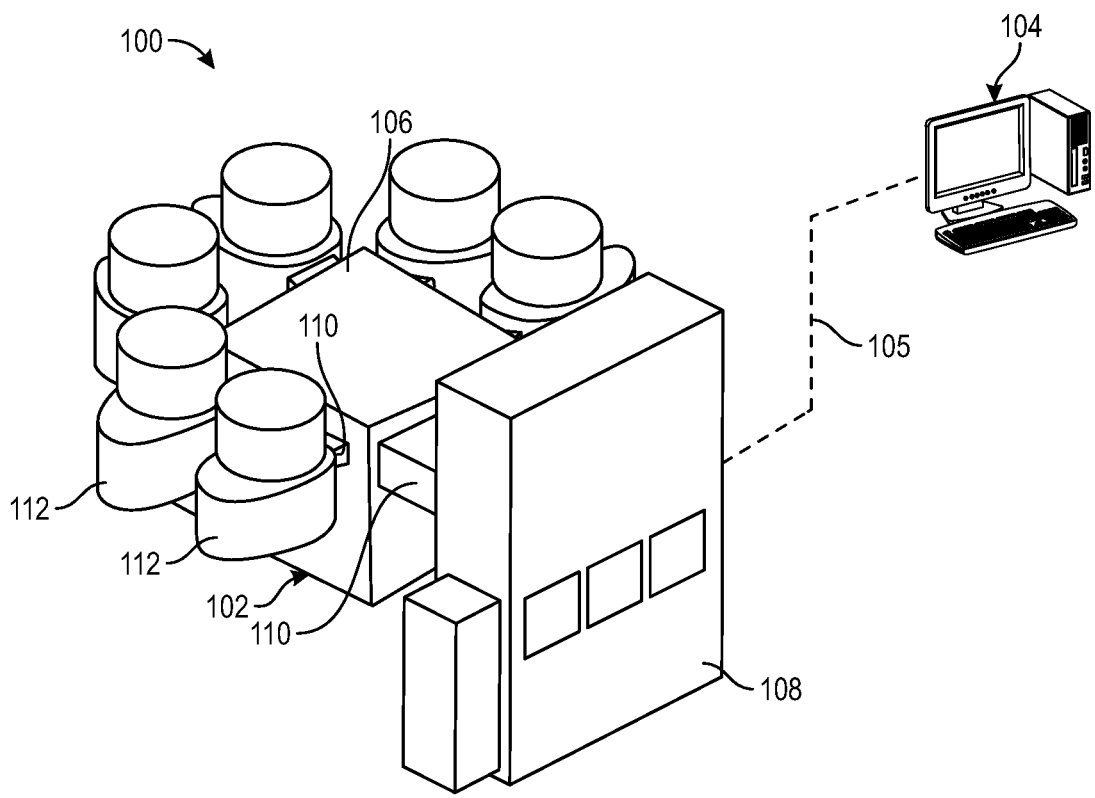
FIG. 1 is an illustration of a processing system, in accordance with an embodiment.

Systems, devices, and methods used for real-time in-situ monitoring of etch and deposition processes, or other manufacturing or control of a wafer fabrication process, are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Existing etch and deposition processes are open loop processes. That is, process recipes include process parameters that are fixed and/or performed over fixed process times without feedback measurements. More particularly, there is no real-time information used to control the process parameters of the process. Existing techniques for measuring material deposition and removal either do not provide real-time measurement and control of a wafer fabrication process, or provide an estimate of material deposition/removal based on correlation to a secondary factor rather than measuring the deposition/removal directly. For example, an ex-situ ellipsometer may be used to measure film thickness, however, since the ellipsometer is a periodic monitor, the ellipsometer cannot detect real-time excursions or drifts in the deposition/removal rate for normal production runs. Furthermore, sensors installed in a process chamber of a processing tool to measure secondary factors, such as RF match positions or gas concentrations in a plasma, do not directly measure the variable of concern (deposition/removal rates). Accordingly, previous attempts at process monitoring and process control have not provided a sufficient real-time control scheme for etch processes, selective removal processes and deposition processes.

Wafer processing equipment including a monitoring device to measure in-situ etch and deposition rates for substrate processing are described below. The monitoring device includes sensors to measure material deposition or material removal in all pressure regimes, e.g., under vacuum conditions, and under plasma-less conditions. The monitoring device can selectively expose a sensor to a chamber volume to monitor a wafer fabrication process. For example, the sensor may include a sensor surface, and a parameter of the sensor, e.g., a resonant frequency, may change when material is deposited on or removed from the sensor surface. Thus, real-time measurement of material deposition or removal amounts or rates, as well as uniformity of such amounts or rates, may be monitored and used to control a wafer fabrication process performed by a wafer processing system. The monitoring device can be movable to locate the sensor in a sealed environment that is isolated from the chamber volume to protect the sensor during an in-situ chamber cleaning (ICC) process.

In an aspect, a monitoring device includes a sensor that can be selectively exposed to a chamber volume of a processing tool. The sensor can be placed in fluid communication with the chamber volume through a hole in a liner wall that extends around the chamber volume, or the sensor can be sealed against an outer liner surface of the liner wall when a blank area of the monitoring device is exposed to the chamber volume through the hole. Accordingly, the sensor can monitor a deposition or removal rate through the hole in the liner wall in real-time during a wafer fabrication process, and can be isolated from the chamber volume during an ICC process. The monitoring device can include several sensors to provide sensor redundancy by providing a backup sensor in the event that a primary sensor fails or reaches an end of life. The several sensors may also provide a selective etch rate monitor for different processes by having different sacrificial materials on the sensors. These and other aspects are described further below.

It will be understood that the processing systems and methods described below could be used in any form factor or process where materials are deposited or removed from a substrate. More particularly, although the processing systems and methods are described with respect to wafer processing for the fabrication of integrated circuits, the devices and methods may also be adapted for use in other technologies, such as displays in the electronics industry and/or photovoltaic cells in the solar industry.

Referring to FIG. 1, an illustration of a processing system is shown in accordance with an embodiment. A processing system 100 may include a processing tool 102 communicatively coupled to a computer system 104 by a communication link 105. Communication link 105 may be a wired or wireless connection, e.g., processing tool 102 and/or components of processing tool 102 may communicate directly or wirelessly with computer system 104.

Processing tool 102 may include a buffer chamber 106 physically connected to a factory interface 108 by one or more load locks 110. Furthermore, one or more process chambers 112 may be physically connected to buffer chamber 106 by one or more respective load locks 110. Buffer chamber 106 may act as an intermediate volume, larger than respective volumes of process chambers 112, that remains at a low pressure, albeit at a pressure higher than the process pressures within process chambers 112. Thus, a substrate of material, e.g., a semiconductor wafer, may be moved between chambers 106, 112 of processing tool 102 under vacuum conditions during the manufacture of semiconductor devices. This movement may be enabled by various devices included in the processing tool 102, e.g., robotic arms, shuttles, etc.

Various manufacturing operations may be performed in process chambers 112. For example, at least one process chamber 112 may be an etch chamber, a deposition chamber, a chamber of a semiconductor lithography tool, or any other substrate processing chamber. As such, process chamber 112 may be used to perform wafer fabrication processes under vacuum conditions, atmospheric conditions, or any other pressure regime. The wafer fabrication processes can include a selective removal process (SRP) to remove material from a substrate disposed in a chamber volume of process chamber 112.

In addition to varying pressure regimes, process chambers 112 may also be used to perform manufacturing processes having different energetic conditions. For example, process chamber 112 may be a radical-driven etch chamber or a deposition chamber that does not include a plasma. That is, process chamber 112 may be plasma-less during a wafer fabrication process.

Figure 2:
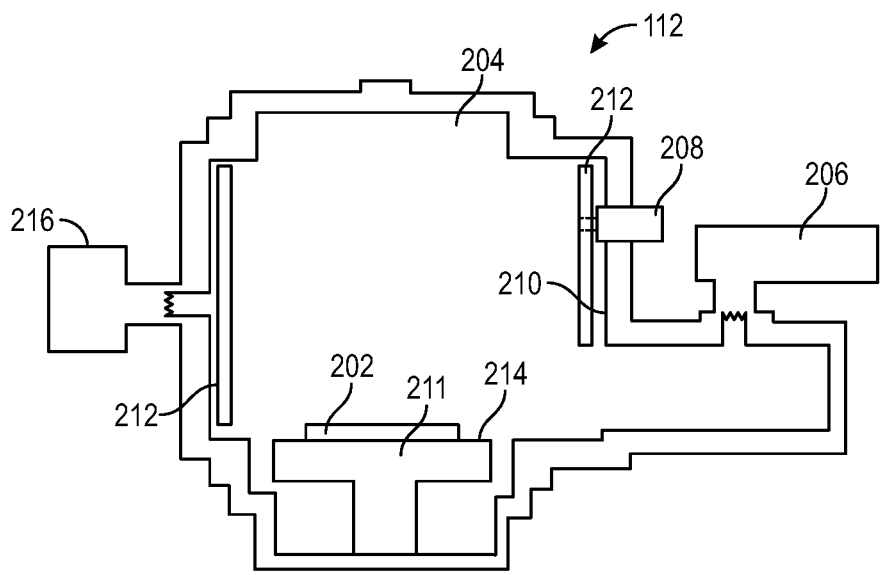
FIG. 2 is an illustration of a monitoring device mounted on a process chamber, in accordance with an embodiment.

Referring to FIG. 2, an illustration of a monitoring device mounted on a process chamber is shown in accordance with an embodiment. A substrate may be subjected to a wafer fabrication process in process chamber 112 of processing tool 102. The substrate may be formed from a material and have a form factor. For example, the substrate may be a wafer 202. Wafer 202 can be formed from any material, e.g., wafer 202 may be a wafer of semiconductor material. Wafer 202 may experience different pressure conditions as the wafer moves through processing tool 102. For example, the wafer may be inserted into the factory interface 108 at atmospheric conditions. Then, as the wafer goes into a load lock 110 between factory interface 108 and buffer chamber 106, the load lock 110 may be brought to a vacuum condition of 120 millitorr. The wafer may then pass from the load lock 110 into buffer chamber 106, having a buffer chamber pressure of 100 millitorr.

Wafer 202 may be transferred from buffer chamber 106 into process chamber 112 through load lock 110. For example, process chamber 112 may include a chamber volume 204 sized to receive wafer 202. Thus, material may be deposited on or removed from wafer 202 during a wafer fabrication process performed within process chamber 112. During the wafer fabrication process, chamber volume 204 of process chamber 112 may have a chamber pressure that is lowered to a vacuum condition using, e.g., a vacuum source 206 such as a vacuum pump and/or turbo pump. In the context of this description, a vacuum condition may be any pressure less than 0.5 atm. In an embodiment, the vacuum condition in process chamber 112 exists when process chamber 112 has a chamber pressure less than the pressure of buffer chamber 106, e.g., less than 100 millitorr. Accordingly, the process chamber 112 may be under vacuum conditions during the manufacturing operation of the wafer fabrication process. Furthermore, the vacuum conditions may reduce or eliminate gaseous mixtures from chamber volume 204, and thus, chamber volume 204 may be plasmaless during the wafer fabrication process.

A monitoring device 208 may be mounted on process chamber 112. For example, monitoring device 208 may pass through an outer chamber wall 210, and may be fixed to outer chamber wall 210, e.g., by a flange fastened to chamber wall 210, and the flange may be sealed against chamber wall 210 by a gasket or another mechanical seal. Monitoring device 208 may have an end adjacent to and/or in contact with a liner wall 212 within chamber volume 204. More particularly, liner wall 212 may be inward from outer chamber wall 210, and may extend around chamber volume 204. Accordingly, liner wall 212 may at least partly define chamber volume 204 containing wafer 202.

Process chamber 112 can include a wafer holder 211 within chamber volume 204. Wafer holder 211 may be, for example, an electrostatic chuck having electrode(s) to electrostatically clamp wafer 202 during a wafer fabrication process. Wafer holder 211 may include a holding surface 214 upon which wafer 202 is clamped. For example, holding surface 214 may be a layer of dielectric material over wafer holder 211.

As described below, monitoring device 208 may monitor material deposition or material removal occurring at an upward facing surface, e.g., a surface facing away from holding surface 214. It is contemplated that monitoring device 208 includes sensors that react with the wafer fabrication process in a manner similar or identical to a material on the upward-facing surface. For example, a source of process chamber 112 may generate radicals to etch wafer 202, and the radicals may similarly etch sensors of monitoring device 208. Thus, monitoring device 208 can detect changes in material removal rates or deposition rates of wafer 202 when the sensors are exposed to chamber volume 204 through liner wall 212. Accordingly, monitoring device 208 can assess an etch rate or deposition rate during a process performed in process chamber 112.

Processing tool 102 may include other sensors and/or measurement instruments to detect a process parameter of the wafer fabrication process. For example, processing tool 102 may include an optical spectrometer 216 mounted on process chamber 112 or otherwise mounted to detect an optical emissions spectrometry (OES) signature of chamber volume 204 during the wafer fabrication process. The OES signature may identify a type and amount of elements within chamber volume 204. For example, the OES signature may identify what chemical elements are present in a plasma within chamber volume 204 during the wafer fabrication process. Other sensors may be used to detect other process parameters of the wafer fabrication process performed in chamber volume 204. Such other sensors may include electrical sensors to measure power delivered to process chamber 112 or wafer 202, electrical sensors to measure electrical characteristics of wafer holder 211, etc. Such sensors may not measure an actual amount or rate of deposition or removal of a material, such as a semiconductor material, but may nonetheless be correlated to actual deposition or removal measurements made by monitoring device 208 for the reasons described below.

Figure 3:
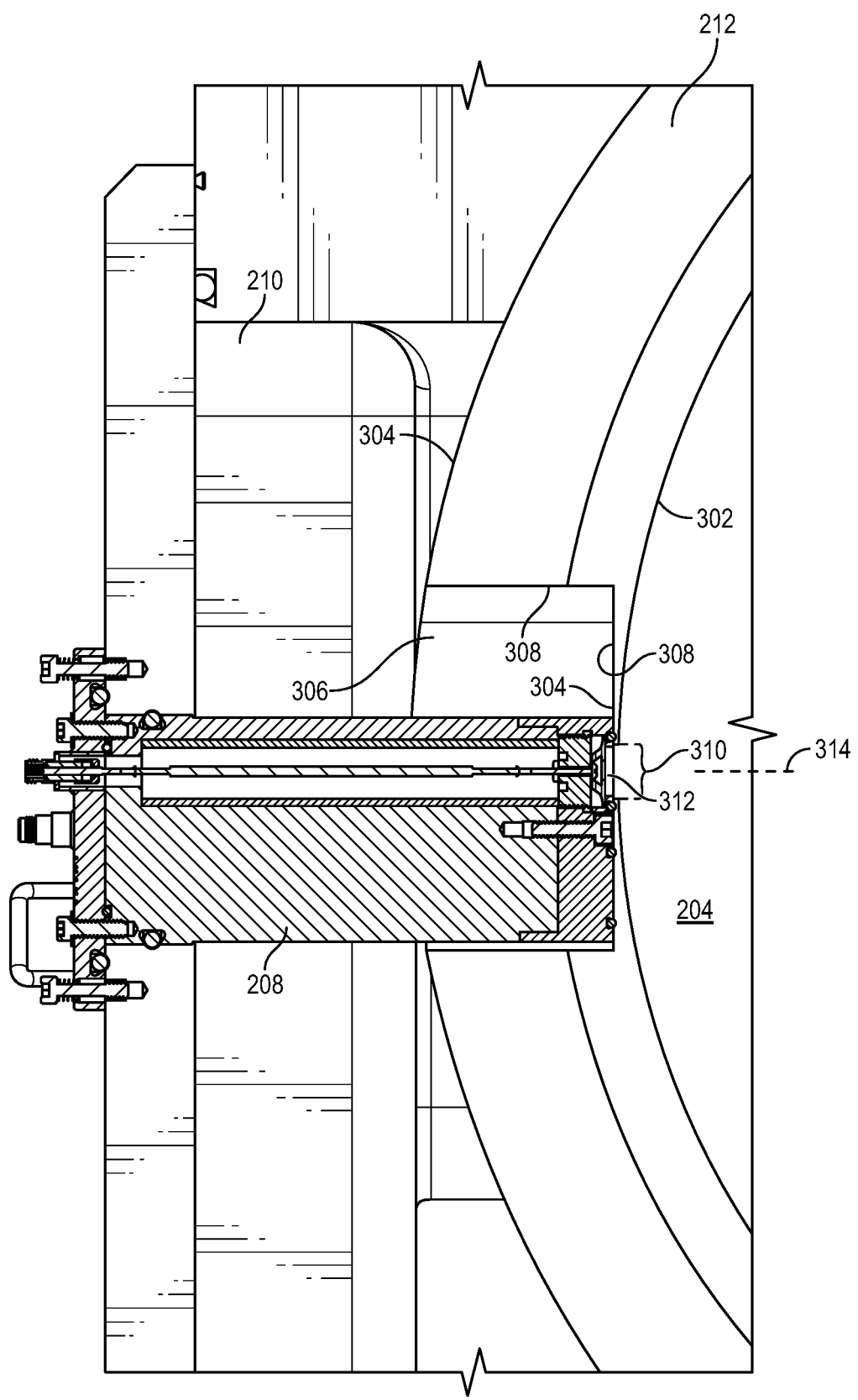
FIG. 3 is a sectional illustration of a monitoring device mounted on a process chamber and having a sensor exposed to a chamber volume, in accordance with an embodiment.

Referring to FIG. 3, a sectional illustration of a monitoring device mounted on a process chamber and having a sensor exposed to a chamber volume is shown in accordance with an embodiment. In an embodiment, liner wall 212 has a wall thickness extending between an inner liner surface 302 and an outer liner surface 304. For example, liner wall 212 may be a cylindrical wall surrounding chamber volume 204 such that inner liner surface 302 faces inward toward chamber volume 204. By contrast, outer liner surface 304 may face outward toward outer chamber wall 210 of process chamber 112.

A liner cavity 306 may be formed in liner wall 212. Liner cavity 306 may extend partly through liner wall 212 from outer liner surface 304 toward inner liner surface 302. Liner cavity 306 may be defined by a cavity wall 308 surrounding liner cavity 306 within liner wall 212. More particularly, cavity wall 308 may be a portion of outer liner surface 304 surrounding liner cavity 306 within liner wall 212.

Chamber volume 204 inward from inner liner surface 302 may be placed in fluid communication with a region outward of outer liner surface 304. More particularly, liner wall 212 may include a hole 310 extending between chamber volume 204 and outer liner surface 304. For example, hole 310 may extend from inner liner surface 302 to cavity wall 308 to place liner cavity 306 in fluid communication with chamber volume 204.

In an embodiment, monitoring device 208 includes a sensor 312. Sensor 312 may have a forward-facing surface, e.g., a sensor surface, aligned with hole 310 along the sensor axis 314. Thus, sensor 312 may be exposed to chamber volume 204 through hole 310 in a first configuration. The first configuration may be a process monitoring configuration, in which sensor 312 is to provide in-situ monitoring of a wafer fabrication process being performed within chamber volume 204. For example, sensor 312 may be a resonant microbalance to monitor the process, although other sensor types are possible (see FIG. 19). In the case of a SRP process, sensor 312 monitors a removal rate of a selected material from wafer 202. In the case of an etch process, sensor 312 monitors an etch rate of one or more layers on wafer 202, or of wafer 202 itself. Similarly, in the case of a deposition process, sensor 312 monitors a deposition rate of a film on wafer 202. The in-situ monitoring by sensor 312 is permitted by the exchange of process gases, ionized gases, radicals and/or materials through hole 310. More particularly, sensor 312 can have a parameter that changes when material is deposited on or removed from the sensor surface. The change of the parameter can be used to determine process characteristics. For example, a rate of removal of material from wafer 202 and/or the sensor surface may be determined based on the change of the parameter. Accordingly, monitoring device 208 may provide in-situ monitoring of a wafer fabrication process.

In an embodiment, sensor 312 may be a micro sensor. "Micro" may refer to the descriptive size of certain sensors or structures in accordance with embodiments. For example, the term "micro sensor" may refer to a sensor having dimensions on the scale of 1 to 100 µm. That is, in an embodiment, sensor 312 may have a sensor surface that includes a maximum width of 1 to 100 µm. Accordingly, sensors 312 may be microbalances, which are instruments capable of making precise measurements of weight on the order of a million parts of a gram, and sensors 312 may be micro sensors sized on a micron scale.

The term "micro sensors" may also refer to sensors that are fabricated using materials and manufacturing processes pertinent to microelectromechanical systems (MEMS). That is, sensors 312 described herein may (in some embodiments) be fabricated using MEMS processes such as deposition processes, patterning, etching, etc. Accordingly, sensors 312 may be MEMS-scale sensors having a size and structure formed using MEMS processes. It is to be appreciated, however, that embodiments are not so limited, and that certain aspects of the embodiments may be applicable to larger, and possibly smaller size scales. For example, the resonant microbalance sensor 312 described herein may not be a micro sensor.

Figure 4:
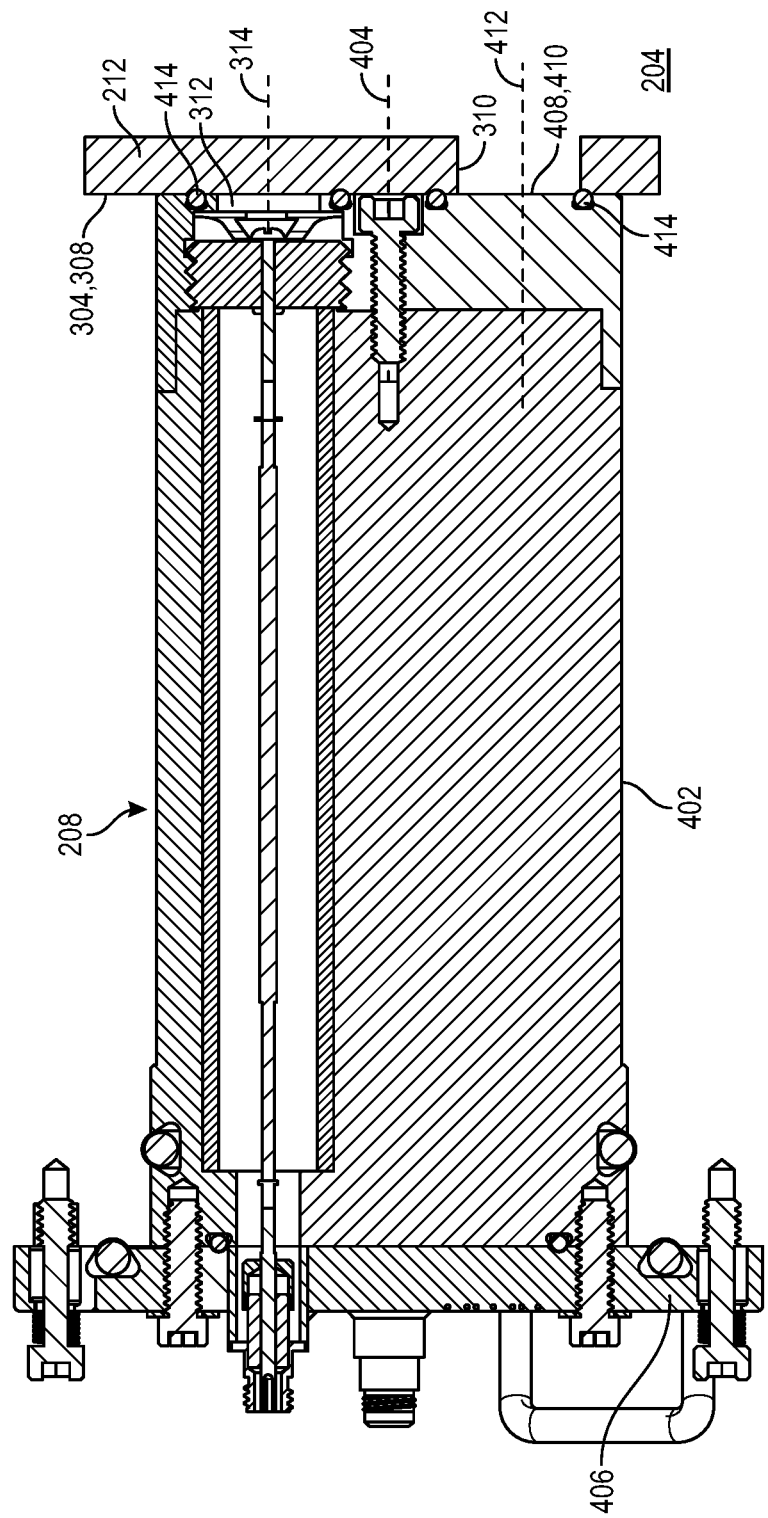
FIG. 4 is a sectional illustration of a monitoring device mounted on a process chamber and having a blank area exposed to a chamber volume, in accordance with an embodiment.

Referring to FIG. 4, a sectional illustration of a monitoring device mounted on a process chamber and having a blank area exposed to a chamber volume is shown in accordance with an embodiment. It is typical to recondition process chamber 112 between wafer fabrication process runs by performing an ICC process. The ICC process can clean the walls and components of process chamber 112 to stabilize the wafer fabrication process. For example, the ICC process can send very aggressive etching chemicals into the system to clean a process kit and the walls of process chamber 112. The aggressive chemicals can shorten a lifetime of sensor 312, and thus, the second configuration can be a sensor protection configuration. That is, whereas the sensor 312 may be exposed to chamber volume 204 in the first configuration, the sensor 312 may be isolated from chamber volume 204 in a second configuration.

Monitoring device 208 can include a device body 402 extending along the central axis 404. More particularly, device body 402 may extend from an outward end having a flange 406 to attach to outer chamber wall 210, to an end face 408 adjacent to liner wall 212. End face 408 may be orthogonal to central axis 404 and/or parallel to outer liner surface 304. More particularly, end face 408 may be a surface that conforms to cavity wall 308 of liner cavity 306. Sensor 312 may be mounted on device body 402 at a first location on end face 408. Similarly, end face 408 may include a blank area 410 laterally offset from sensor 312. For example, blank area 410 may be on an opposite side of central axis 404 from sensor 312. A blank axis 412 may extend parallel to central axis 404 and through blank area 410. Similarly, sensor axis 314 may extend parallel to central axis 404 and through the sensor surface of sensor 312. In an embodiment, blank axis 412 and sensor axis 314 are equidistant from central axis 404. Accordingly, monitoring device 208 may be rotated about central axis 404 to move sensor 312 out of alignment with hole 310 and to move blank area 410 into alignment with hole 310.

In the second configuration, blank area 410 is exposed to chamber volume 204 through hole 310. Furthermore, sensor 312 is not exposed to chamber volume 204 through hole 310. Monitoring device 208 can include one or more seals 414 to seal the sensor 312 and/or blank area 410 against outer liner surface 304. For example, a first seal 414 may extend around sensor 312, and the first seal 414 may be pressed against cavity wall 308 to prevent ingress of gases from an area behind outer liner surface 304 into an area in front of sensor 312. Similarly, a second seal 414 may extend around blank area 410, and the second seal 414 may be pressed against cavity wall 308 to prevent egress of gases from chamber volume 204 into the area behind outer liner surface 304 through hole 310.

Figure 5:
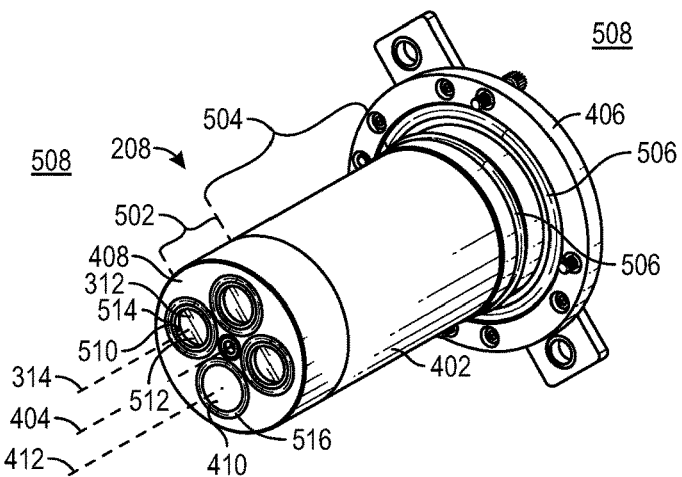
FIG. 5 is a perspective illustration of a monitoring device, in accordance with an embodiment.

Referring to FIG. 5, a perspective illustration of a monitoring device is shown in accordance with an embodiment. In an embodiment, device body 402 of monitoring device 208 includes a device head 502 and a device base 504. Flange 406 may extend radially outward from an end of device base 504. One or more fastener holes may extend through flange 406 to allow flange 406 to be fastened to process chamber 112 by one or more fasteners, e.g., bolts, screws, pins, etc. Monitoring device 208 may include one or more flange seals 506 extending over a flat face of flange 406 and/or a cylindrical face of flange 406. Flange seals 506 can be pressed against process chamber 112 when flange 406 is fastened onto process chamber 112 to prevent gases to (or from) leaking from chamber volume 204 from (or into) a surrounding environment 508 outside of process chamber 112.

Device head 502 may be coupled to an end of device base 504 opposite from flange 406. Device head 502 can have a cylindrical outer surface extending from device base 504 to end face 408. In an embodiment, end face 408 of device head 502 includes a recess 510. Recess 510 may extend longitudinally into device head 502. Accordingly, sensor 312 may be mounted in recess 510. Recess 510 may have a depth equal to or greater than a thickness of sensor 312 such that a sensor surface 512 of sensor 312 is at a same longitudinal location along central axis 404 as end face 408, or sensor surface 512 is longitudinally between end face 408 and flange 406 along central axis 404.

In an embodiment, monitoring device 208 includes a sensor seal 514 mounted on end face 408. Sensor seal 514 may be a gasket to provide a mechanical seal between end face 408 and outer liner surface 304 when the gasket is pressed between the surfaces. For example, sensor seal 514 may be an O-ring formed from a compliant material that may be squeezed between end face 408 and outer liner surface 304. Accordingly, sensor seal 514 may have a profile that extends around sensor axis 314. More particularly, sensor seal 514 may extend entirely around recess 510.

End face 408 may be longitudinally between a forward-facing surface of sensor seal 514 and flange 406. Accordingly, sensor surface 512 may be exposed to surrounding environment 508 through sensor seal 514, e.g., through a central passage of an inner diameter of sensor seal 514. When sensor seal 514 is squeezed between end face 408 and outer liner surface 304 in the first configuration, sensor surface 512 is exposed to chamber volume 204 through hole 310. By contrast, when sensor seal 514 is squeezed between end face 408 and outer liner surface 304 and the second configuration, sensor surface 512 is isolated within a cavity between end face 408, outer liner surface 304, and a radially inward surface of sensor seal 514.

In an embodiment, monitoring device 208 includes a blank seal 516 mounted on end face 408. Blank seal 516 may be a gasket similar to sensor seal 514, e.g., blank seal 516 may be an O-ring formed from a compliant material. Accordingly, blank seal 516 may have a profile that extends around blank axis 412. More particularly, blank seal 516 may extend entirely around blank area 410 of end face 408.

End face 408 may be longitudinally between a forward-facing surface of blank seal 516 and flange 406. Accordingly, blank area 410 may be exposed to surrounding environment 508 through blank seal 516, e.g., through a central passage or an inner diameter of blank seal 516. When blank seal 516 is squeezed between end face 408 and outer liner surface 304 and the second configuration, blank area 410 is exposed to chamber volume 204 through hole 310.

Figure 6:
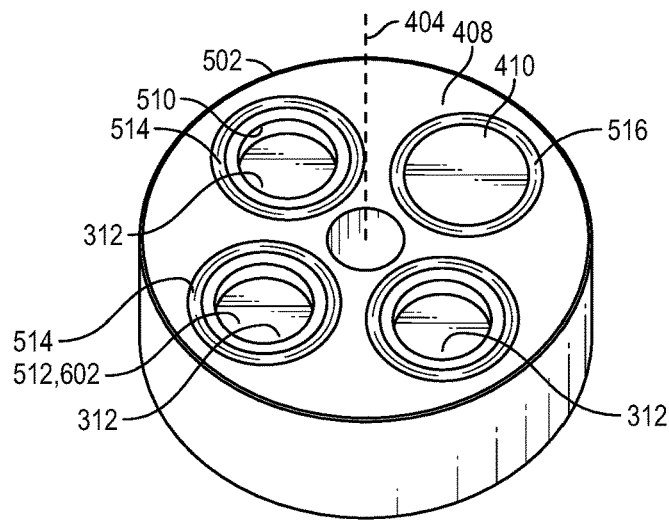
FIG. 6 is a front perspective illustration of a device head of a monitoring device, in accordance with an embodiment.

Referring to FIG. 6, a front perspective illustration of a device head of a monitoring device is shown in accordance with an embodiment. In an embodiment, device head 502 may be detached from device base 504. For example, a fastener may extend through device head 502 along central axis 404 and be screwed into device base 504. By removing the fastener, device head 502 may be removed. Accordingly, device head 502 may be manufactured and sold as a replacement part that includes one or more sensors 312 loaded into device head 502 and exposed through respective recesses 510.

Device head 502 may include several recesses 510 and blank area 410 distributed about central axis 404. In an embodiment, monitoring device 208 includes three sensors 312 and blank area 410 distributed symmetrically about central axis 404. More particularly, the respective sensor axes of each sensor 312 and blank axis of blank area 410 may be radially spaced from central axis 404 by a same distance. Furthermore, an angle between each axis measured with a vertex at central axis 404 may be equal. For example, in the case of four rotational positions, each axis may be separated from a next axis by 90 degrees when measured about central axis 404. Furthermore, the several sensors 312 and blank area 410 may be surrounded by a respective seal 414, e.g., a respective sensor seal 514 or blank seal 516.

Sensor 312 may include a resonant body 602 having a disc shape. The disc shape can include sensor surface 512 facing forward through the respective recess 510 and/or hole 310. The disc shape can also include a rear surface (FIG. 7) facing away from recess 510.

Figure 7:
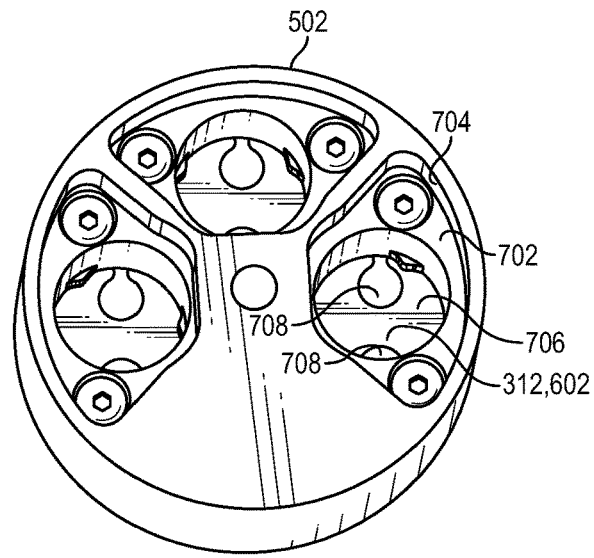
FIG. 7 is a rear perspective illustration of a device head of a monitoring device, in accordance with an embodiment.

Referring to FIG. 7, a rear perspective illustration of a device head of a monitoring device is shown in accordance with an embodiment. In an embodiment, device head 502 includes a retaining insert 702 to hold sensors 312 within device head 502. Device head 502 can have a rear recess 704 to receive sensor 312 such that a rear sensor surface 706 of sensor 312 is backward-facing. Retaining insert 702 can be inserted into rear recess 704 and fixed to device head 502 by one or more fasteners. Device head 502 can include rear contacts 708 pressed against rear sensor surface 706 to transmit electrical signals to and from resonant body 602 of sensor 312.

Figure 8:
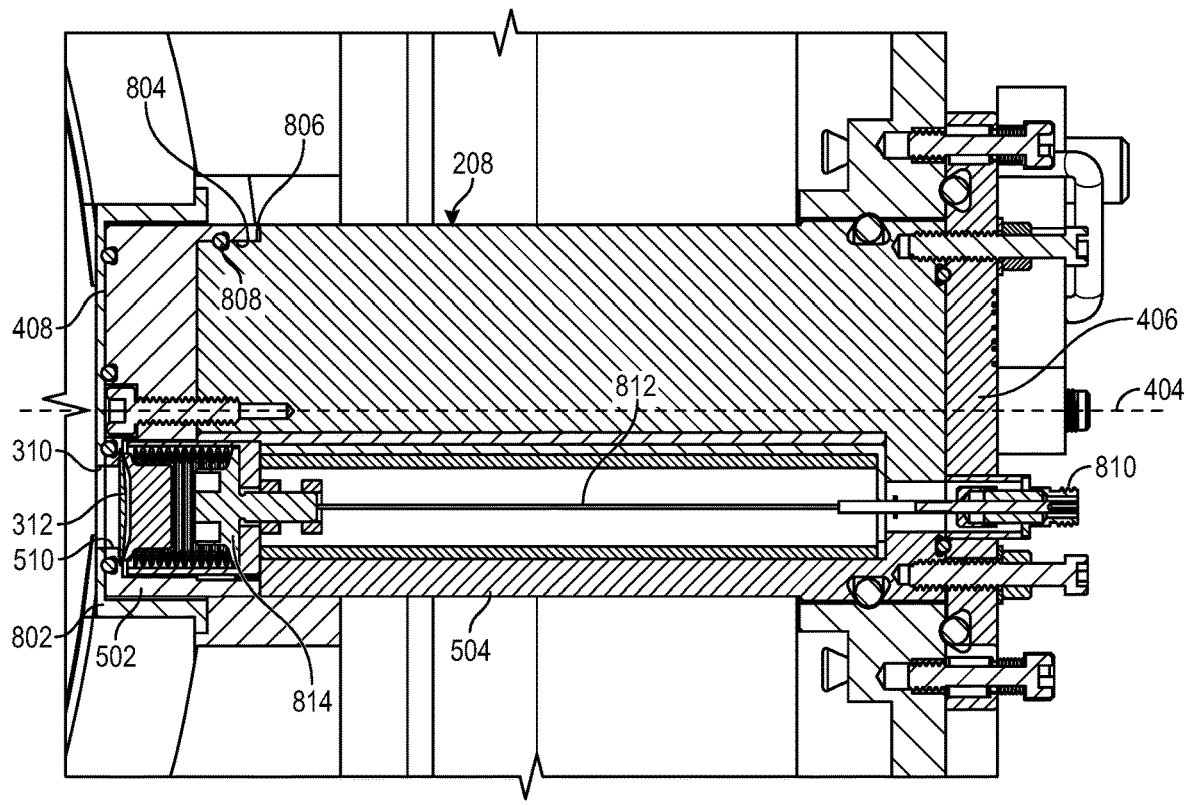
FIG. 8 is a sectional illustration of a monitoring device mounted on a process chamber, in accordance with an embodiment.

Referring to FIG. 8, a sectional illustration of a monitoring device mounted on a process chamber is shown in accordance with an embodiment. Mounting device may be capable of rotation about central axis 404. For example, device head 502 may be received within a liner insert 802. Liner insert 802 may contain liner cavity 306. Liner cavity 306 may be a cylindrical recess within liner insert 802, which conforms to an outer cylindrical surface of device head 502. Accordingly, by unbolting flange 406 from process chamber 112, a user may spin mounting device within liner insert 802 to cause a different one of a sensor location or a blank location on end face 408 to align with hole 310.

In an embodiment, only one location on end face 408 is aligned with hole 310 at a time, and the other locations are isolated against cavity wall 308 at the time. The ability to isolate sensors from chamber volume 204 can be used to set a sampling frequency for monitoring device 208. For example, a one-in-five sampling pattern may be used to expose a particular sensor 312 to chamber volume 204 at the measurement position one out of every five processed wafers 202. The particular sensor 312 may be in the isolation position for the next four wafers 202 as the user indexes from one sensor 312 to the next by rotating monitoring device 208. The ability to set a sampling frequency allows for trade-offs between data collection rate and sensor lifetime.

In the case of SRPs, the rotational monitoring device 208 can provide for monitoring of various radical etch processes. For example, sensor 312 may have a coating on resonant body 602 that corresponds to the material that is being removed from wafer 202. By way of example, wafer 202 may be a semiconductor material wafer 202 and or may include a semiconductor material that is removed during a SRP. Sensor surface 512 may also include the semiconductor material as a coating to be removed during the SRP to monitor the wafer fabrication process. By way of example, wafer 202 may be silicon wafer, and sensor 312 may include a thin coating layer, e.g., 15-20 microns, of silicon deposited on a resonant body 602. Accordingly, when silicon is removed from wafer 202 during the SRP, silicon is also removed from sensor 312 through hole 310. Similarly, a different wafer 202 may be fabricated from a different semiconductor material, and a different sensor 312 may include a thin coating layer of the different semiconductor material. Accordingly, when the different wafer 202 is loaded into chamber volume 204 and the different sensor 312 is aligned with hole 310, the different semiconductor material may be simultaneously removed from the different wafer 202 and the different sensor 312. Accordingly, monitoring device 208 may include several sensors having different pre-coated materials intended to monitor wafer fabrication processes for different types of wafers 202.

In an example, wafer 202 may be fabricated from a first material and include a coating of a second material. Sensor 312 may include a coating layer of the second material. Accordingly, when wafer 202 is loaded into chamber volume 204 and sensor 312, which includes a coating layer of the second material is aligned with hole 310, the second material may be simultaneously removed from wafer 202 and sensor 312.

Monitoring device 208 may be configured to reduce a likelihood of radicals or gases entering an interface between device head 502 and device base 504. For example, device head 502 may include a head sealing surface 804 extending around central axis 404. Head sealing surface 804 may be adjacent to device base 504. More particularly, device base 504 may have a base sealing surface 806 extending around central axis 404, and head sealing surface 804 may face base sealing surface 806. The sealing surfaces may be parallel to central axis 404 and/or orthogonal to central axis 404. A gap may exist between the sealing surfaces that provides a route for gases to enter monitoring device 208. To prevent such ingress of gas between device head 502 and device base 504, a body seal 808 may be disposed between head sealing surface 804 and base sealing surface 806. Body seal 808 may be a gasket or another type of mechanical seal that is mounted on device head 502 and/or device base 504, and compressed between the sealing surfaces. Body seal 808 can prevent gases from entering monitoring device 208 during an ICC process, which could otherwise etch rear sensor surface 706 within rear recess 704 of device head 502.

Sensor 312 may generate electrical sensor output signals corresponding to a change in a parameter, as materials are removed from or deposited onto sensor surface 512. For example, a frequency of the electrical sensor output signals may change based on a mass of resonant body 602, which in turn changes as material is deposited or removed. Accordingly, to monitor the wafer fabrication process in real-time, the electrical sensor output signals are transmitted and communicated to computer system 104 through a wall of process chamber 112. In an embodiment, monitoring device 208 includes an electrical vacuum feedthrough 810 electrically connected to sensor 312 to communicate the electrical signals via communication link 105. Electrical vacuum feedthrough 810 may include one or more electrical pins passing through a vacuum seal to carry the electrical signals outward from monitoring device 208. Electrical vacuum feedthrough 810 may be connected to an electrical cable 812 that extends longitudinally through monitoring device 208 to a power connector 814.

Figure 9:
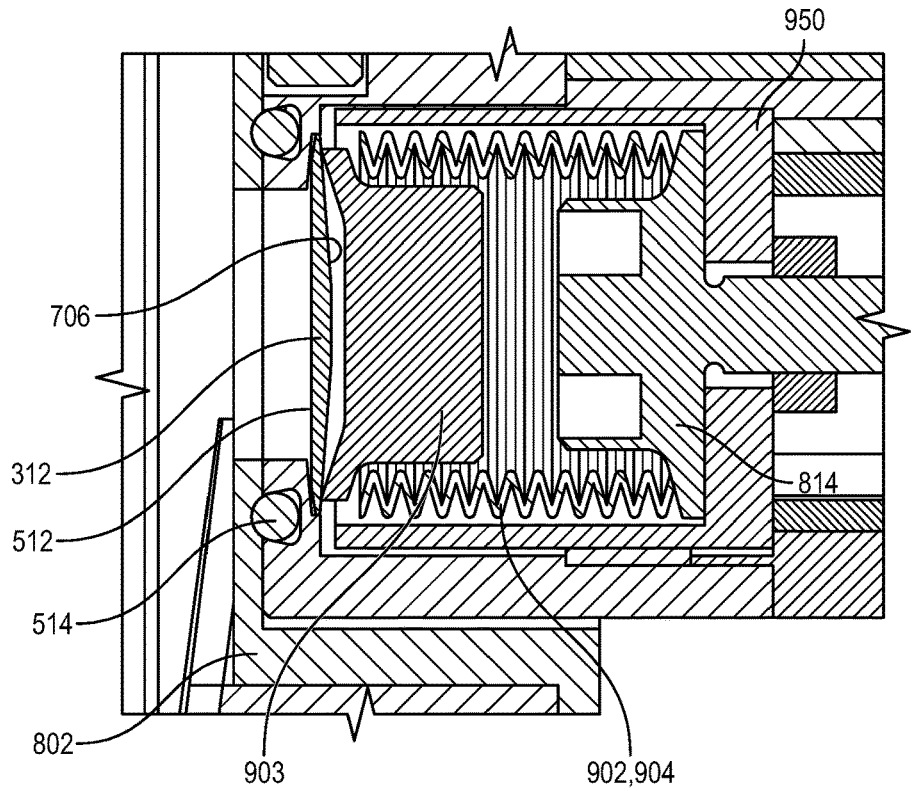
FIG. 9 is a detailed illustration of an electrical connection of a monitoring device, in accordance with an embodiment.

Referring to FIG. 9, a detailed illustration of an electrical connection of a monitoring device is shown in accordance with an embodiment. Power connector 814 can be electrically connected to rear sensor surface 706 of sensor 312, and thus, electrical vacuum feedthrough 810 may be electrically connected to rear sensor surface 706 via power connector 814.

In an embodiment, monitoring device 208 includes a compressible connector 902 in contact with rear sensor surface 706. Compressible connector 902 may be a conductive structure having a first end pressed against power connector 814 and a second end pressed against a supportive plate 903 that is in contact with rear sensor surface 706. By way of example, compressible connector 902 may be a metallic spring extending between power connector 814 and supportive plate 903. Supportive plate 903, compressible connector 902, and power connector 814 may be conductive elements formed from a conductive material such as aluminum. The conductive elements may form a conductive path. The conductive path may be contained within a cylindrical cavity of an insulator shield 950. Insulator shield 950 may be a ceramic cylinder having an end wall with a hole to allow passage of power connector 814. Accordingly, compressible connector 902 may conduct electrical signals from supportive plate 903 to power connector 814 through insulator shield 950, and outward to electrical cable 812 through the end wall.

In an embodiment, compressible connector 902 is a bellows 904 formed from aluminum or stainless steel. Bellows 904 may be compressed between supportive plate 903 and power connector 814 to ensure good electrical contact. Bellows 904 may have similar resilience to a spring connector. Bellows 904 may, however, have less inductance than a spring connector.

Electrical contact between supportive plate 903 and rear sensor surface 706 can be provided through rear contacts 708 described above and/or through a conductive coating deposited on rear sensor surface 706. For example, rear sensor surface 706 may include an aluminum coating to conduct electrical signals from sensor 312 to supportive plate 903.

Figure 10:
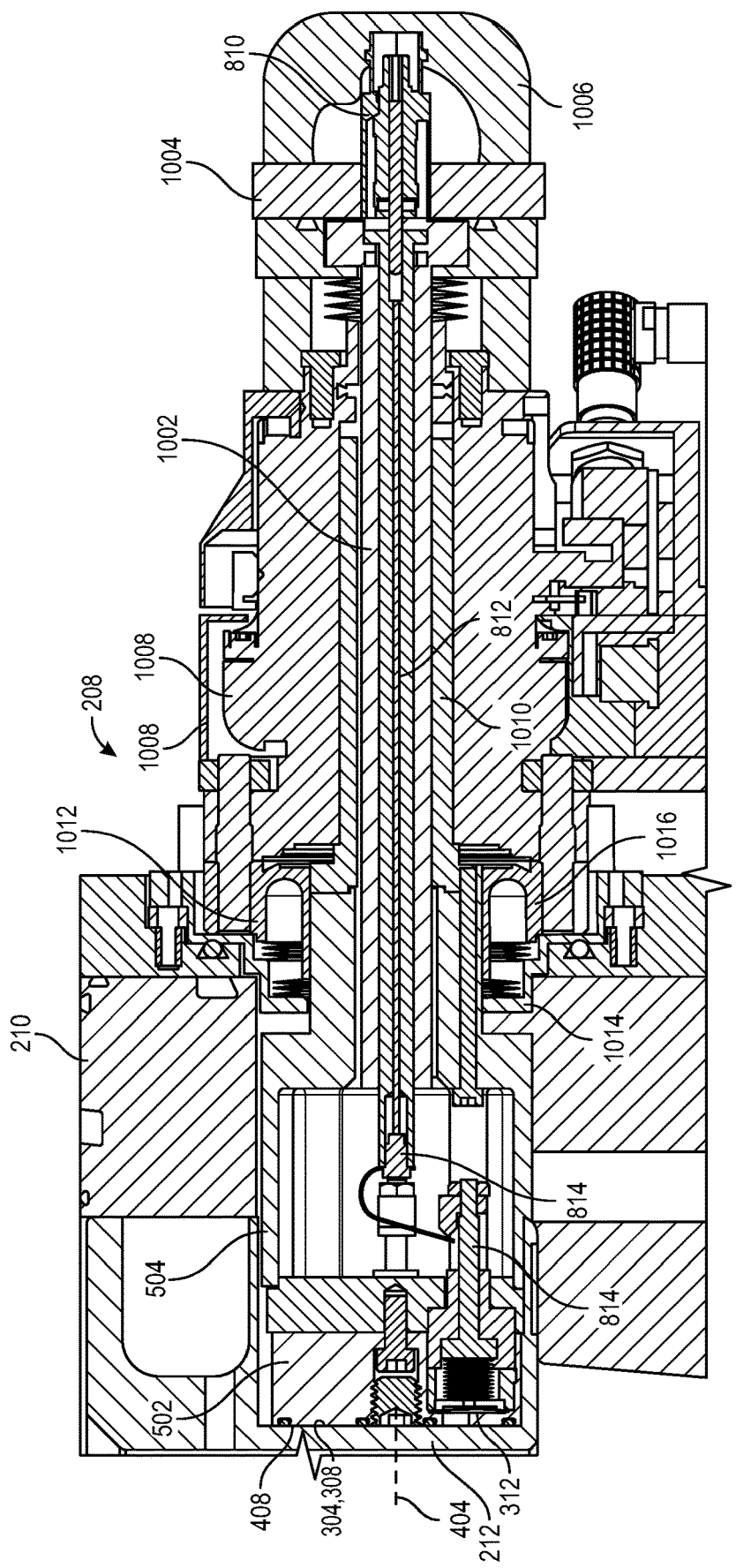
FIG. 10 is a sectional illustration of an automated monitoring device mounted on a process chamber, in accordance with an embodiment.

Referring to FIG. 10, a sectional illustration of an automated monitoring device having motion actuators and mounted on a process chamber is shown in accordance with an embodiment. Monitoring device 208 may be automatically moved in an axial direction along central axis 404, and rotationally about central axis 404. In an embodiment, monitoring device 208 includes a stationary connecting rod 1002 extending along central axis 404 to electrical vacuum feedthrough 810. Connecting rod 1002 may be stationary in the sense that it may be fixed to a slide plate 1004 that does not rotate about central axis 404. Slide plate 1004 may, however, moved linearly by sliding within a bracket 1006 as described in more detail with respect to FIGS. 13-16. The linear motion can retract and advance monitoring device out of an into process chamber 112. Accordingly, connecting rod 1002 may be rotationally stationary and linearly movable.

Electrical cable 812 may extend through connecting rod 1002 from electrical vacuum feedthrough 810 toward power connector 814 within a distal portion of device base 504 near device head 502. Power connector 814 may be a two-part electrical connector, and may be termed a spring contact. The spring contact structure is described in more detail below with respect to FIG. 12.

Figure 13:
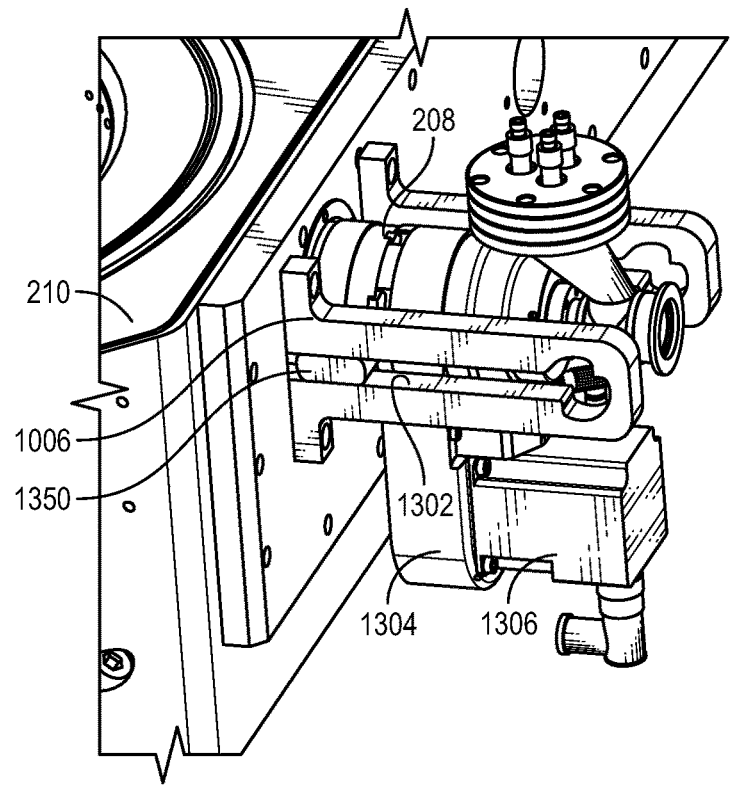
FIGS. 13-15 are perspective illustrations showing operations of a maintenance procedure for a monitoring device, in accordance with an embodiment.

Monitoring device 208 may include a rotary vacuum feedthrough 1008 used to rotate device head 502 and device base 504 about central axis 404. Rotary vacuum feedthrough 1008 may include an outer casing and an inner portion that rotate relative to each other. The outer casing may include several magnets that interact magnetically with several magnets attached to the inner portion. Rotary vacuum feedthrough 1008 may be driven by a pulley (FIG. 13). More particularly, a motor (FIG. 13) may rotate a pulley and pull the pulley over an outer surface of the outer casing to cause the outer casing to rotate about central axis 404. Rotation of the outer casing can apply a torque to the magnets of the inner portion, causing the inner portion to also rotate about central axis 404. The magnetic application of torque can be performed through a vacuum housing between the outer casing and the inner portion such that rotary vacuum feedthrough 1008 does not allow gases to leak between process chamber 112 and surrounding environment 508.

In an embodiment, the inner portion of rotary vacuum feedthrough 1008 is attached to an outer surface of a rotating shaft 1010. Rotating shaft 1010 may be concentric with connecting rod 1002. Unlike connecting rod 1002, however, rotating shaft 1010 may rotate freely about central axis 404 when rotary vacuum feedthrough 1008 applies a torque to the outer surface. Furthermore, rotating shaft 1010 may have a distal end connected to device base 504. Thus, torque may be transmitted through rotating shaft 1010 from rotary vacuum feedthrough 1008 to device base 504. Likewise, when device base 504 rotates, device head 502 rotates.

Linear actuation of device head 502 is provided by an actuator of processing tool 102. In an embodiment, processing tool 102 includes a pneumatic actuator 1012 having ends that move relative to one another. As described below with respect to FIG. 12, a first end 1014 may be coupled to chamber wall 210, and the second end 1016 may be coupled to monitoring device 208. Actuation of pneumatic actuator 1012 can cause first end 1014 to move relative to second end 1016. For example, a distance between first end 1014 and second end 1016 may increase or reduce when air is flowed into or out of a gap between the ends. Accordingly, pneumatic actuator 1012 can be actuated to move end face 408 away from outer liner surface 304. More particularly, retraction of device head 502 away from liner wall 212 can be caused by pneumatic actuation of pneumatic actuator 1012.

As described above, device head 502 may be moved linearly along central axis 404 through actuation of one or more linear actuators, and device head 502 may be rotated about central axis 404 through actuation of one or more rotary actuators. Accordingly, device head 502 can be moved linearly forward to compress seals 414 against cavity wall 308, and device head 502 can be moved linearly backward to form a gap between end face 408 and cavity wall 308 such that device head 502 may be rotated without damaging seals 414. Similarly, device head 502 can be rotated about central axis 404 when the gap is formed to move one position on end face 408, e.g., sensor 312, away from hole 310 while rotating another position on end face 408, e.g., blank position, toward hole 310. That is, actuators of processing tool 102 can be actuated to retract device head 502 from cavity wall 308, rotate device head 502 about central axis 404, and advance device head 502 to compress seals 414 against cavity wall 308. Advancement of device head 502 may include releasing actuators such that a spring return force brings end face 408 near cavity wall 308. A vacuum generated in chamber volume 204 may therefore pull end face 408 toward cavity wall 308 to compress the seals 414.

Figure 11:
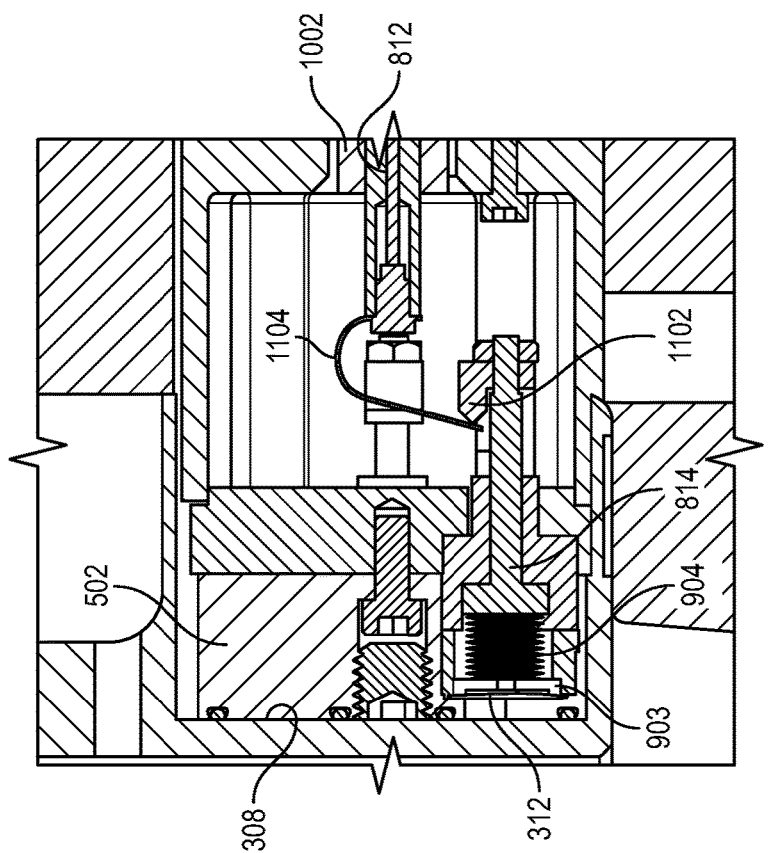
FIG. 11 is a detailed illustration of an electrical connection of an automated monitoring device, in accordance with an embodiment.

Referring to FIG. 11, a detailed illustration of an electrical connection of an automated monitoring device is shown in accordance with an embodiment. Sensor 312 may be electrically connected to electrical cable 812 through one or more intervening structures, as described above with respect to FIG. 9. The intervening structure may be a spring type contact. For example, supportive plate 903 and bellows 904 may conduct electrical output signals from sensor 312 to power connector 814. Power connector 814 may have a longitudinal rod extending backward to a connection prong 1102. The electrical structure connected to sensor 312 may be fixed to device head 502, and thus, linear movement of device head 502 may cause linear movement of connection prong 1102.

The electrical structure used to conduct signals from sensor 312 to electrical vacuum feedthrough 810 may also include a fixed portion. More particularly, a spring connector 1104 may be attached to connecting rod 1002. Connecting rod 1002 may be stationary with respect to second end 1016 of pneumatic actuator 1012. Accordingly, when device head 502 moves linearly under the actuation of pneumatic actuator 1012, spring connector 1104 remains in place. That is, spring connector 1104 remains stationary and connection prong 1102 moves. Linear actuation of device head 502 may be such that, when device head 502 is advanced against liner wall 212, connection prong 1102 contacts spring connector 1104. By contrast, when device head 502 is retracted from liner wall 212, connection prong 1102 may be spaced apart from spring connector 1104. Accordingly, an electrical contact between connection prong 1102 and spring connector 1104 may be formed when device head 502 is advanced, and an electrical disconnect between connection prong 1102 and spring connector 1104 may be formed when device head 502 is retracted. Furthermore, when an electrical contact between connection prong 1102 and spring connector 1104 is formed, electrical output signals from sensor 312 can be communicated to electrical vacuum feedthrough 810. By contrast, when an electrical disconnect between connection prong 1102 and spring connector 1104 is formed, no electrical signals are communicated between sensor 312 and electrical vacuum feedthrough 810.

It will be understood that the ability to separate connection prong 1102 and spring connector 1104 allows several connection prongs 1102 to make contact with a single spring connector 1104. That is, spring connector 1104 may bow toward a position that makes contact with whichever connection prong 1102 is attached to the sensor 312 exposed to hole 310. More particularly, a connection prong 1102 of a first sensor 312 structure exposed to hole 310 may press against spring connector 1104 to form an electrical contact. When a second sensor 312 is to be exposed to the hole 310, device head 502 is retracted to separate the first connection prong 1102 from spring connector 1104. Device head 502 may then be rotated to bring the second sensor 312 into alignment with hole 310, and device had may be released. When device head 502 advances toward cavity wall 308, the second connection prong 1102 associated with the second sensor 312 may make contact with spring connector 1104. Thus, each connection prong 1102 can be rotated into alignment with spring connector 1104, engage spring connector 1104, disengage from spring connector 1104, and be rotated out of alignment with spring connector 1104.

Figure 12:
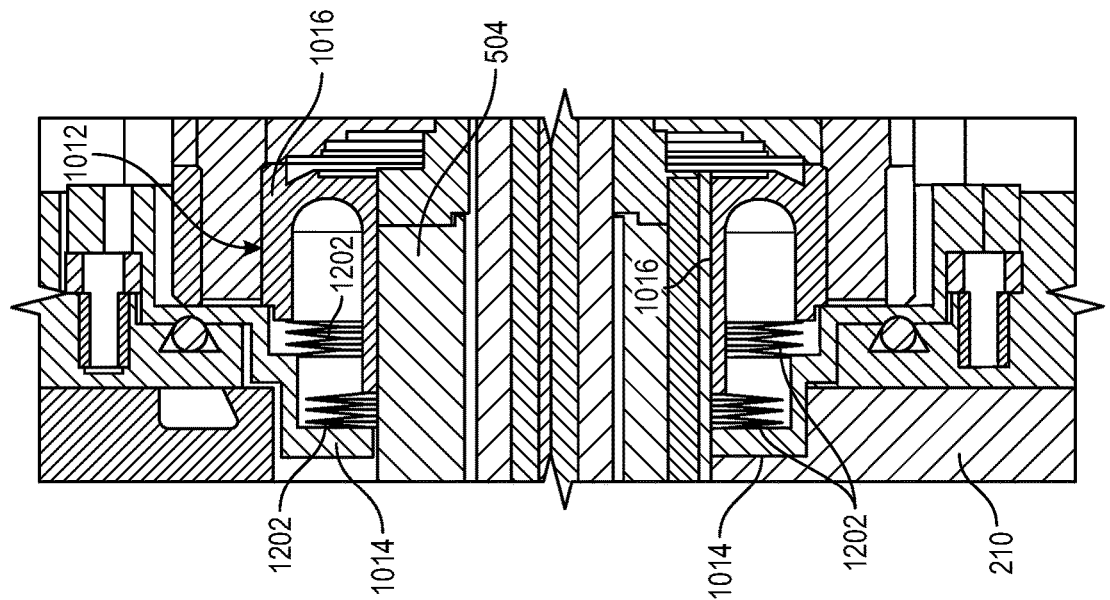
FIG. 12 is a detailed illustration of a pneumatic actuator of an automated monitoring device, in accordance with an embodiment.

Referring to FIG. 12, a detailed illustration of a pneumatic actuator of an automated monitoring device is shown in accordance with an embodiment. Pneumatic actuator 1012 can include first end 1014 attached to chamber wall 210 and second end 1016 attached to device base 504. First end 1014 and second end 1016 may be movably coupled by one or more linear springs 1202. For example, a leftward linear spring 1202 may be compressed between a first wall of first end 1014 and a first edge of second end 1016. Similarly, a rightward linear spring 1202 may be compressed between a second wall of first end 1014 and a second edge of second end 1016. The linear springs can provide a preload to force first end 1014 away from second end 1016.

The linear springs may bias device head 502 away from cavity wall 308, or toward cavity wall 308, depending on their placement. In an embodiment, the bias of the linear springs may be insufficient to overcome the pull on end face 408 provided by a vacuum within chamber volume 204. Accordingly, the gap between first end 1014 and second end 1016 inside of which linear springs reside may be filled with a gas to pressurize the gap. When the gap is pressurized, it can force second end 1016 away from first end 1014, and thus, may retract device head 502 from cavity wall 308. The gap may be a cavity that is pressurized using, e.g., nitrogen or another purge gas. In addition to causing linear retraction of device head 502, the pressure may be higher than the pressure in process chamber 112 to ensure that radicals do not escape chamber volume 204 and enter into the cavity between first end 1014 and second end 1016.

Referring to FIG. 13, a perspective illustration showing an operation of a maintenance procedure for a monitoring device is shown in accordance with an embodiment. A procedure for replacing device head 502 and/or sensors 312 within device head 502 is provided. Sliding plate 1004 may have sliding prongs 1350 that extend radially outward from monitoring device 208. In an embodiment, sliding prong 1350 extends through a slot 1302 in bracket 1006. Sliding prong 1350 may have a thickness that allows sliding prong 1350 to move linearly within slot 1302, however, rotation of sliding prong 1350 is prevented because a width of slot 1302 is less than a length of sliding prong 1350. In a first configuration, when monitoring device 208 is mounted on process chamber 112, sliding prong 1350 may be fully forward within slot 1302.

It is noted that pulley 1304 and motor 1306 used to drive rotary vacuum feedthrough 1008 are shown in FIG. 13.

Pulley 1304 may extend around a wheel, and the wheel may be mounted on a drive shaft of motor 1306. Accordingly, motor 1306 may drive pulley 1304 rotationally, and the rotation can be transmitted to rotary vacuum feedthrough 1008 as described above.

Figure 14:
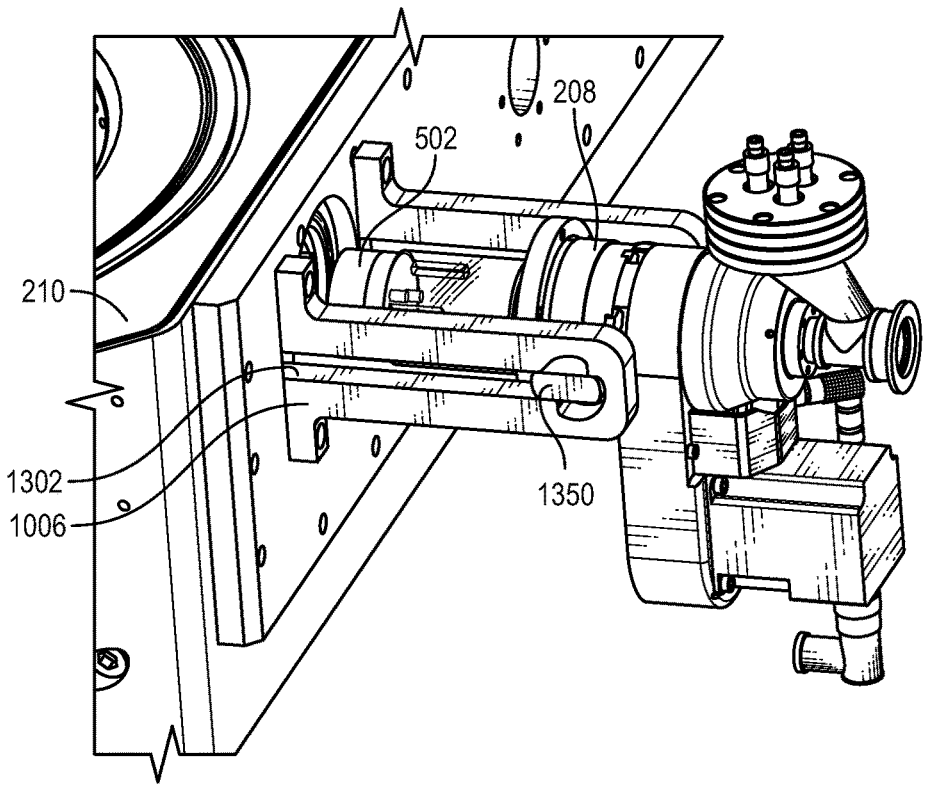

Referring to FIG. 14, a perspective illustration showing an operation of a maintenance procedure for a monitoring device is shown in accordance with an embodiment. The architecture of bracket 1006 may allow sliding prong 1350 to slide linearly through slot 1302. When sliding prong 1350 slides linearly, monitoring device 208 can be retracted from process chamber 112. Rotation of monitoring device 208 during the retraction process is prevented by the relative dimensions of sliding prong 1350 and slot 1302 of bracket 1006. By preventing rotation of monitoring device 208, accidental impact between device head 502 and process chamber 112 is prevented. Accordingly, sensors 312 within device head 502 are protected against impacts until device head 502 has cleared process chamber 112.

Figure 15:
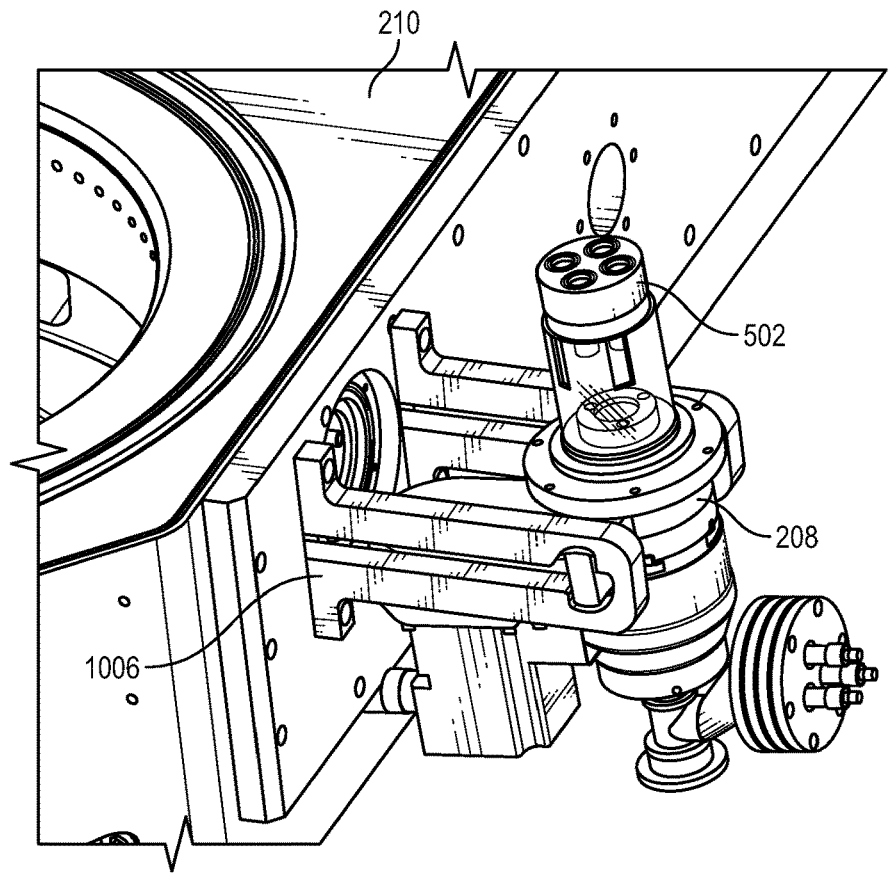

Referring to FIG. 15, a perspective illustration showing an operation of a maintenance procedure for a monitoring device is shown in accordance with an embodiment. When monitoring device 208 has been retracted and device head 502 has cleared process chamber 112, slide plate 1004 may be rotated within bracket 1006 to orient device head 502 toward a user. More particularly, rotation of monitoring device 208 makes device head 502 more accessible to a user to allow device head 502 to be detached from device base 504. Rotation of sliding prong 1350 within bracket 1006 is permitted because bracket 1006 has a proximal slot area that is wider than a distal slot area.

Figure 16:
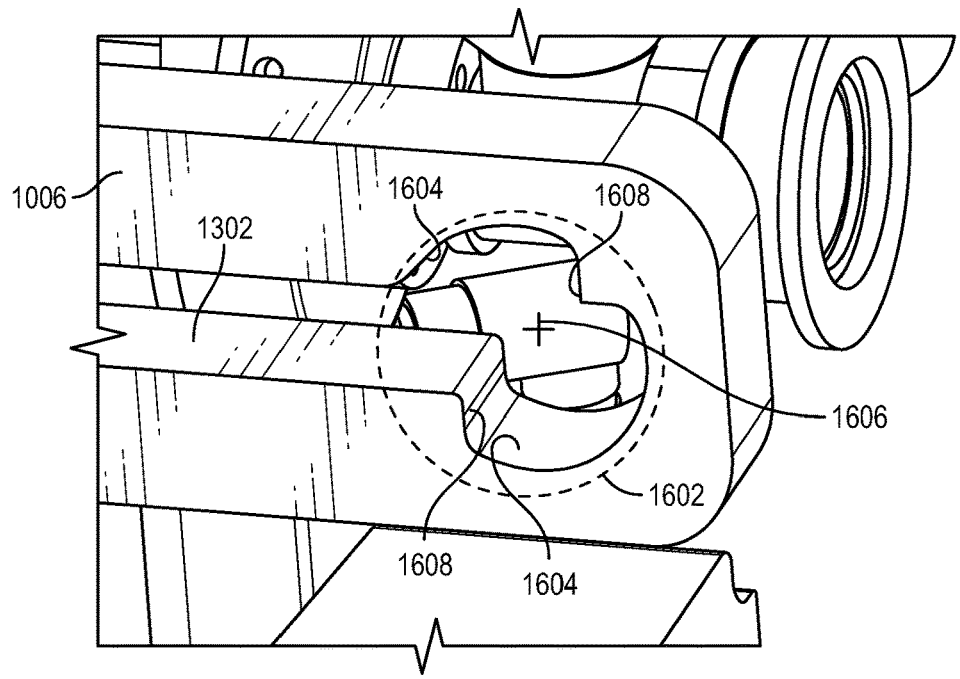
FIG. 16 is a detailed illustration of a support bracket used to hold a monitoring device of a processing system, in accordance with an embodiment.

Referring to FIG. 16, a detailed illustration of a support bracket used to hold a monitoring device of a processing system is shown in accordance with an embodiment. The proximal slot area 1602 of bracket 1006 includes a pair of curvilinear surfaces mirrored about a slot center 1606. More particularly, a first curvilinear profile surface 1604 sweeps upward from a top surface of slot 1302 toward a first slot stop 1608. Similarly, a second curvilinear profile surface 1604 sweeps downward from an end of slot 1302 toward a second slot stop 1608. The curvilinear profile surfaces 1604 may be mirrored about a horizontal plane passing through slot center 1606. A radial distance between first curvilinear profile surface 1604 and second curvilinear profile surface 1604 may be greater than a length of slide plate 1004. Accordingly, when slide plate 1004 is retracted into proximal slot area 1602, the width across proximal slot area 1602 is greater than the length of slide plate 1004, and slide plate 1004 may rotate about slot center 1606. Rotation of slide plate 1004 will continue until an upper surface of slide plate 1004 contacts the first slide stop and/or a lower surface of slide plate 1004 contacts the second slide stop. Accordingly, bracket 1006 includes a slot 1302 that allows linear movement of slide plate 1004 between a distal end at process chamber 112 and proximal slot area 1602. Slot 1302, however, allows rotational movement of slide plate 1004 within proximal slot area 1602.

The components of monitoring device 208 may be formed from materials that are commonly used in process chamber design. For example, each of the components that are exposed to chamber volume 204 and/or vacuum may be formed from aluminum, stainless steel, or a suitable polymer. Several examples are provided here by way of example. Connection prong 1102 may be stainless steel. Connecting rod 1002 may be aluminum. Device head 502 and device base 504 may be aluminum. Supportive plate 903 may be aluminum. Accordingly, the components of monitoring device 208 may be safely exposed to radicals and/or vacuum originating in process chamber 112.

Figure 17:
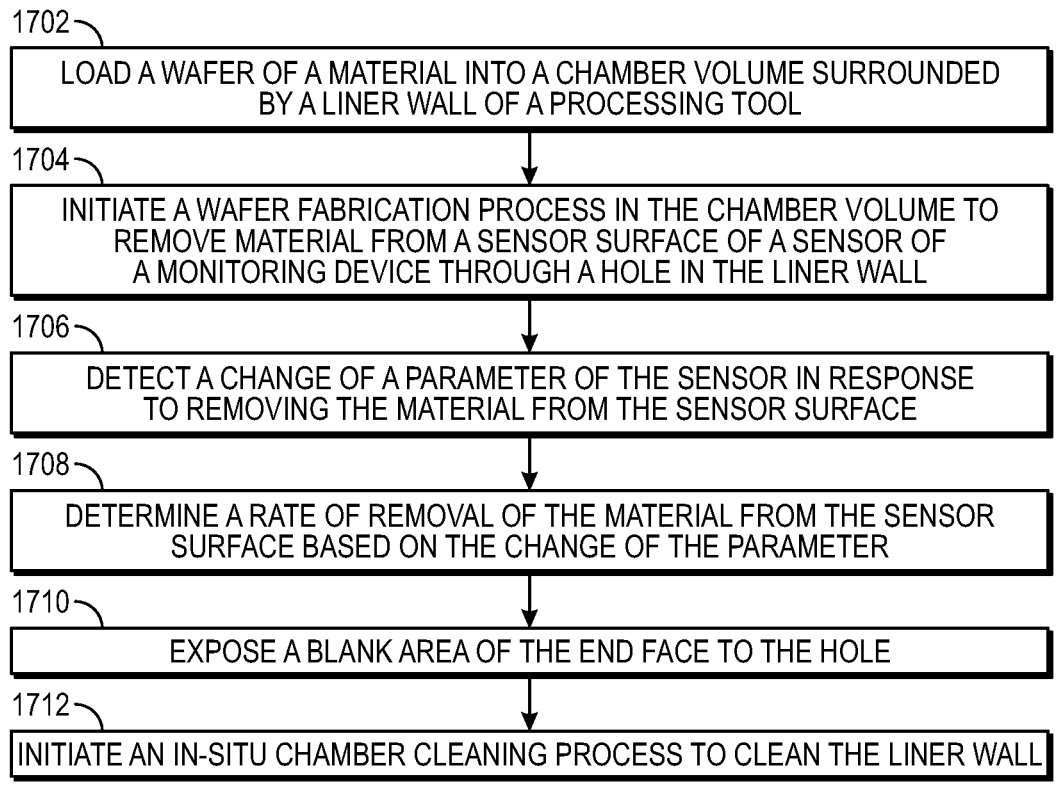
FIG. 17 is an illustration of a flowchart representing operations of a method of monitoring a wafer fabrication process, in accordance with an embodiment.

Referring to FIG. 17, an illustration of a flowchart representing operations of a method of monitoring a wafer fabrication process is shown in accordance with an embodiment. In an embodiment, the wafer fabrication process is a SRP, and sensor 312 includes a resonant microbalance to monitor etch rate of the SRP. At operation 1702, a wafer 202 of a material is loaded into chamber volume 204 of processing tool 102. The material of wafer 202 may or may not be a semiconductor material, as described above. For example, wafer 202 may be a first material (semiconductor or non-semiconductor material) having a coating layer of a second material (semiconductor or non-semiconductor material). Wafer materials may include: dielectric materials such as SiO2, SiN, etc.; metallic materials used for interconnectors such as W and Cu; hard mask etch materials such as PECVD hardmask carbon, glass, silicon, etc. The wafer material may be any substrate material. The selective etch rate can be monitored by monitoring device 208 when the etch processes are radical etch type processes having radicals introduced into chamber volume 204 by either remote plasma sources or microwave plasma sources.

Liner wall 212 may extend around chamber volume 204, and thus, liner wall 212 may surround wafer 202. As described above, liner wall 212 includes hole 310 between chamber volume 204 and outer liner surface 304, and thus, when SRP is performed on wafer 202, radicals and materials may be communicated through hole 310 from chamber volume 204 to a region outside of liner wall 212. Accordingly, a first region on end face 408 may be exposed to hole 310 in liner wall 212. For example, first sensor 312 may be rotated into a detect position, where the first sensor 312 is exposed to chamber volume 204 through hole 310. That is, monitoring device 208 may include sensor 312 having sensor surface 512 aligned with hole 310. When the first sensor 312 is in the detect position, the other sensors 312 may be maintained in isolated positions and not exposed to the process.

At operation 1704, the wafer fabrication process is initiated in chamber volume 204. For example, a material is removed from wafer 202 in a SRP. As described above, sensor surface 512 may include the material, and thus, the material may be removed from sensor surface 512 through hole 310 during the wafer fabrication process.

At operation 1706, a change of a parameter of sensor 312 is detected in response to removing the material from sensor surface 512. Sensor 312 types are described further below. By way of example, however, a frequency of an electrical signal from sensor 312 may change as the mass of sensor 312 changes. The change in frequency can be used to monitor the SRP.

At operation 1708, a rate of removal of the material from sensor surface 512 can be determined based on the change of the parameter. For example, when the frequency of the electrical signal from sensor 312 changes, computer system 104 can use the frequency data to determine the rate of material removal. Similarly, the change may be used to detect an amount of material removed from sensor 312, and thus, the amount of material removed from wafer 202.

At operation 1710, a second region on end face 408 may be exposed to hole 310. For example, blank area 410 of end face 408 may be exposed to hole 310. Blank area 410 may be exposed to hole 310 by moving sensor surface 512 out of alignment with hole 310, and moving blank area 410 into alignment with hole 310. For example, as described above, device head 502 may be retracted from cavity wall 308, rotated about central axis 404, and advanced toward cavity wall 308. Retraction and advancement of device head 502 may be performed under vacuum when a manual or automated force is provided by a user or pneumatic actuator 1012.

At operation 1712, an ICC process is initiated to clean liner wall 212. During ICC, all sensors 312 may be isolated from radicals and gases originating in chamber volume 204. For example, the respective sensor seals 514 surrounding each sensor 312 may be compressed between cavity wall 308 and end face 408, and thus, each sensor 312 may be protected from the aggressive ICC.

Figure 18A:
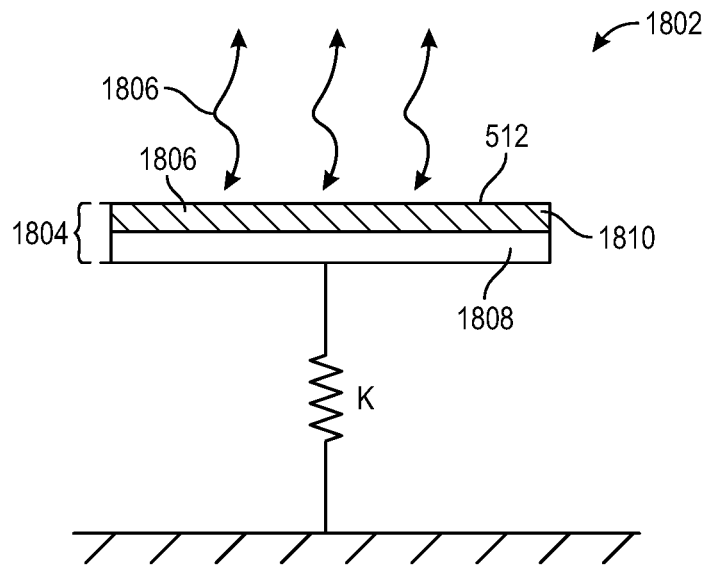
FIG. 18A-18B are schematic illustrations of a resonator type of sensor of a processing system, in accordance with an embodiment.

Referring to FIG. 18A, a schematic illustration of a resonator type of sensor of a processing system is shown in accordance with an embodiment. In an embodiment, one or more sensors 312 of wafer processing tool 102 include a resonator 1802. Resonator 1802 may be a suitable resonant mass sensor, such as a Quartz Crystal Microbalance (QCM), Surface Acoustic Wave (SAW), or Film Bulk Acoustic Resonators (FBAR), which all quantify the cumulative mass of material deposited on their surfaces. A description of the complexity and variety of resonators 1802 is not described here in favor of a simplified description for the purpose of brevity and ease of understanding. Each resonator 1802 may have a characteristic frequency, e.g., a resonant frequency, as is known in the art. For example, without going into great detail, resonator 1802 may be represented by a simple mass-spring system as is shown in FIG. 18A. The characteristic frequency of resonator 1802 may be inversely proportional to a mass 1804 of the resonator 1802 system. For example, the characteristic frequency may be proportional to the square root of 'k' divided by 'M' of the resonator 1802 system, where 'M' corresponds to mass 1804 and 'k' corresponds to a spring constant of the resonator 1802 system. Thus, it will be recognized that the characteristic frequency shifts when resonator 1802 receives or gives off a material 1806, e.g., during a wafer fabrication process. More particularly, when material 1806, e.g., semiconductor material, is deposited on or removed from a sensor surface 512 of resonator 1802 within wafer processing tool 102, mass 1804 of resonator 1802 changes, and accordingly, the characteristic frequency shifts.

Sensor surface 512 of resonator 1802 may be an exposed surface, e.g., facing forward toward hole 310. A portion of resonator 1802 having sensor surface 512, however, may include several layers. For example, resonator 1802 may include a base layer 1808 under a top layer 1810 having sensor surface 512. Base layer 1808 and top layer 1810 may include a same material. For example, base layer 1808 and top layer 1810 may be formed from a same silicon material. In an embodiment, base layer 1808 is formed from a different material than top layer 1810. For example, base layer 1808 may be resonant body 602, and top layer 1810 may be a coating of silicon material deposited on base layer 1808. Thus, top layer 1810 may cover a portion of base layer 1808.

In an embodiment, sensor surface 512 includes material 1806. More particularly, sensor 312 may include a sensor surface 512 formed from a same material as material deposited on or removed from wafer 202 during a wafer fabrication process. For example, when the wafer fabrication process is a deposition process to deposit silicon onto a silicon wafer 202, sensor surface 512 may include silicon to ensure that the deposited material 1806 interacts with sensor surface 512 in a similar manner to the interaction with wafer 202. Similarly, when the wafer fabrication process is an etching process to remove silicon from the silicon wafer 202, sensor surface 512 may include silicon to ensure that material 1806 is etched from sensor surface 512 at a similar rate to a removal rate of silicon from the silicon wafer 202. Accordingly, sensor surface 512 may simulate a surface of wafer 202 to measure an actual deposition rate or removal rate that is simultaneously occurring to wafer 202 during the wafer fabrication process.

Figure 18B:
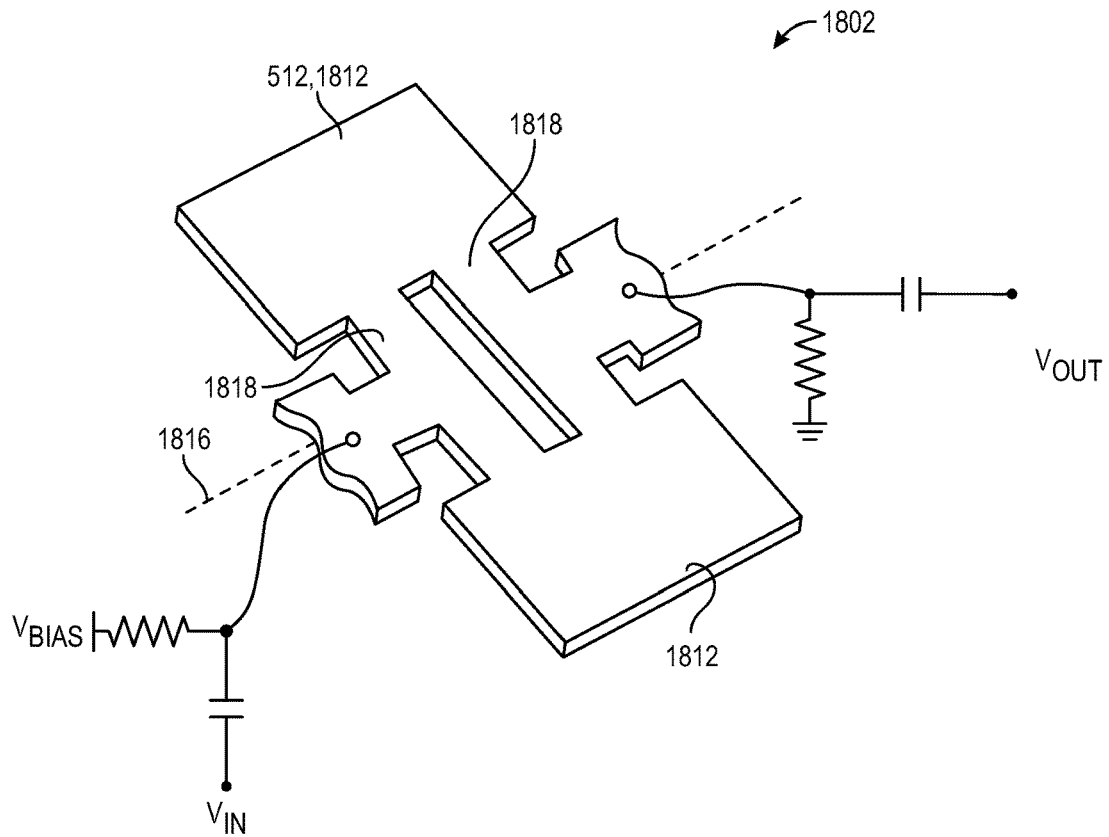

Referring to FIG. 18B, a schematic illustration of a resonator type of sensor of a processing system is shown in accordance with an embodiment. A particular type of resonator 1802 that may be used as a sensor 312 is a MEMS resonant mass sensor, such as a thermally actuated high-frequency single crystalline silicon resonator. Such resonators 1802 may be fabricated as individual devices or arrays using single mask processes. Resonator 1802 may include two pads 1812 on either side of a plane of symmetry 1816. A fluctuating electrical current may be passed between the two pads 1812 to cause an alternating current (AC) ohmic loss component in the current path. In an embodiment, most of the ohmic loss occurs in thin pillars 1818 that interconnect the pads 1812. Thin pillars 1818 may be centrally located and extend between the pads 1812 in a direction orthogonal to plane of symmetry 1816. Fluctuating temperature generated in pillars 1818 may cause an AC force, and an alternating thermal stress in pillars 1818, to actuate resonator 1802 in an in-plane resonant mode. In the in-plane resonant mode, pads 1812 having mass 1804, e.g., 'M', vibrate in opposite directions. Thus, at resonance, resonator 1802 includes a characteristic frequency of the vibrating pads 1812, and a resistance of pillars 1818 is modulated by an alternating mechanical stress due to a piezoresistive effect. Accordingly, there is a detectable small signal motional current in resonator 1802 corresponding to the characteristic frequency.

Figure 19:
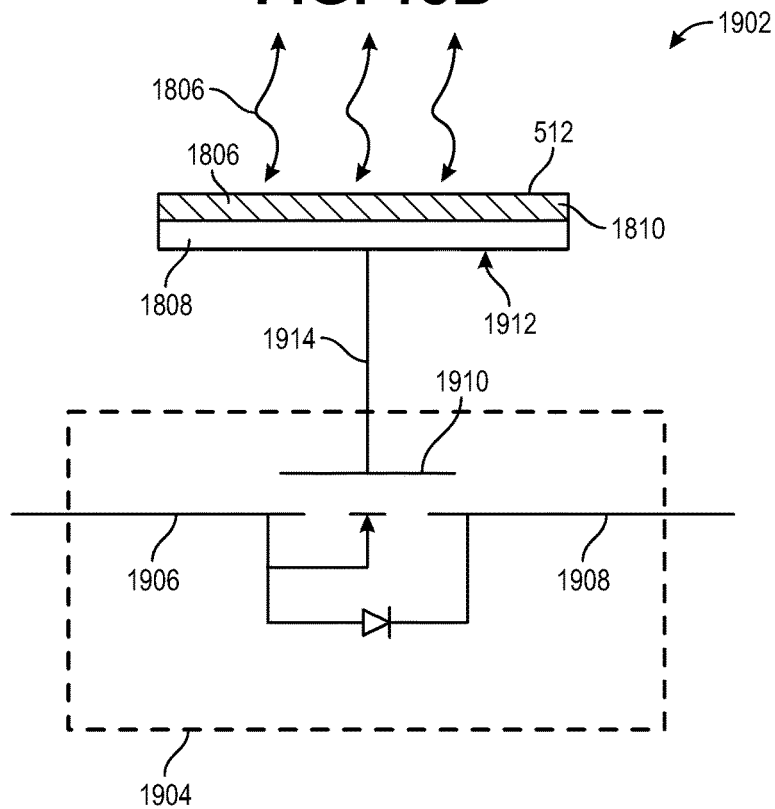
FIG. 19 is a schematic illustration of a transistor sensor type of sensor of a processing system, in accordance with an embodiment.

Referring to FIG. 19, a schematic illustration of a transistor sensor type of sensor of a processing system is shown in accordance with an embodiment. In an embodiment, one or more sensors 312 of wafer processing tool 102 include a transistor sensor 1902. Transistor sensor 1902 may include one or more transistor, e.g., a MOSFET 1904. MOSFET 1904 may include a source 1906, a drain 1908, and a gate 1910. Transistor sensor 1902 may also include a collector 1912, similar to mass 1804 described with respect to FIGS. 18A-18B, to receive or emit material 1806 during a wafer fabrication process. Collector 1912 may be physically separated from MOSFET 1904, however, the subcomponents may be electrically connected with each other. For example, collector 1912 may be electrically connected to gate 1910 of MOSFET 1904 through an electrical trace 1914. Thus, MOSFET 1904 may be configured to detect that material 1806 has landed on or evaporated from collector 1912 even when collector 1912 is located at a predetermined location spaced apart from MOSFET 1904.

Collector 1912 may be sized and configured to receive material 1806. For example, a typical size of material 1806 particles may be in a range of 45 nanometers to 1 micron, and thus, collector 1912 may include an outer profile having an outer rim with a diameter of at least 1 micron. A shape of the outer rim when viewed in a downward direction may be circular, rectangular, or any other shape. Furthermore, collector 1912 may be flat, e.g., may have a planar sensor surface 512, or collector 1912 may have a conical sensor surface 512. In an embodiment, collector 1912 is not a separate structure from MOSFET 1904, but instead, is incorporated into MOSFET 1904. For example, collector 1912 may be a collection area on gate 1912 of MOSFET 1904.

Similar to resonator 1802 described above, collector 1912 of transistor sensor 1902 may include sensor surface 512 configured to simulate a surface of wafer 202. For example, sensor surface 512 on collector 1912 may be oriented to face a forward direction toward hole 310. Collector 1912 may include a multi-layer structure, e.g., having base layer 1808 and top layer 1810 of same or different material.

In an embodiment, a parameter of transistor sensor 1902 corresponds to MOSFET 1904. More particularly, the parameter of transistor sensor 1902 may be a threshold voltage of MOSFET 1904 as measured across gate 1910. The threshold voltage may correspond directly to the presence or absence of material 1806 on collector 1912. For example, the threshold voltage may have a first value when a first amount of material 1806 is on collector 1912, and the threshold voltage may have a second value (different than the first value) when a second amount of material 1806 is on collector 1912. Thus, material 1806 collected or emitted from sensor surface 512 of collector 1912 may be determined based on the threshold voltage of transistor sensor 1902. A processor of computer system 104 may be configured to detect a change in the threshold voltage, and thus, when a change in the threshold voltage is detected, wafer processing tool 102 can note the change as an amount of material deposition or removal. The threshold voltage may be logged over time to determine an actual deposition rate or removal rate of material for wafer 202.

Sensors 312 may include other sensor types. For example, one or more sensors 312 of wafer processing tool 102 may be an optical sensor (not shown). Optical sensor may be a Micro-Opto-Electro-Mechanical Systems (MOEMS) as is known in the art, and may be formed directly on a substrate using known processing operations, e.g., semiconductor processing operations. A description of the complexity and variety of MOEMS is not described here in favor of a simplified description for the purpose of brevity and ease of understanding. Optical sensor may include several micro mirrors or lenses distributed across the sensor surface 512 of the substrate. Without going into great detail, optical sensor may include an optical path emanating from a light source. Optical path may be between light source and a light detector. In an embodiment, a parameter of optical sensor corresponds to whether light is received from light source at light detector. For example, the parameter may change in response to material disturbing optical path. That is, when particles of material pass through or rest in optical path and block light between light source and light detector, the parameter may change. In an embodiment, when particle passes through optical sensor, light from light source is reflected along a different optical path toward another light detector. Detection of the reflected light by the other light detector may result in a change to the parameter of optical sensor. The parameter may be, for example, an output voltage of optical sensor corresponding to light detection. A processor of computer system 104 may be configured to detect a change in the output voltage, and thus, when a change in the output voltage and/or when a disturbance in optical path is detected, wafer processing tool 102 can note the change as a deposition or removal of material from sensor surface 512 on the substrate, and thus, deposition/ removal amounts and/or rates may be measured and monitored in real-time.

It will be appreciated that, since the sensors types described above operate on the basis of electrical parameters that are independent of external pressures, wafer processing tool 102 having one or more sensors 312 such as resonator 1802, transistor sensor 1902, or optical sensor may work at any pressure regime, including under vacuum conditions. Similarly, sensors 312 may operate regardless of a gaseous consistency of chamber volume 204, including under plasma-less conditions. The electrical parameters may be output from all of the sensor types to electrical cable 812 and electrical vacuum feedthrough 810 to transmit data to computer system 104.

Figure 20:
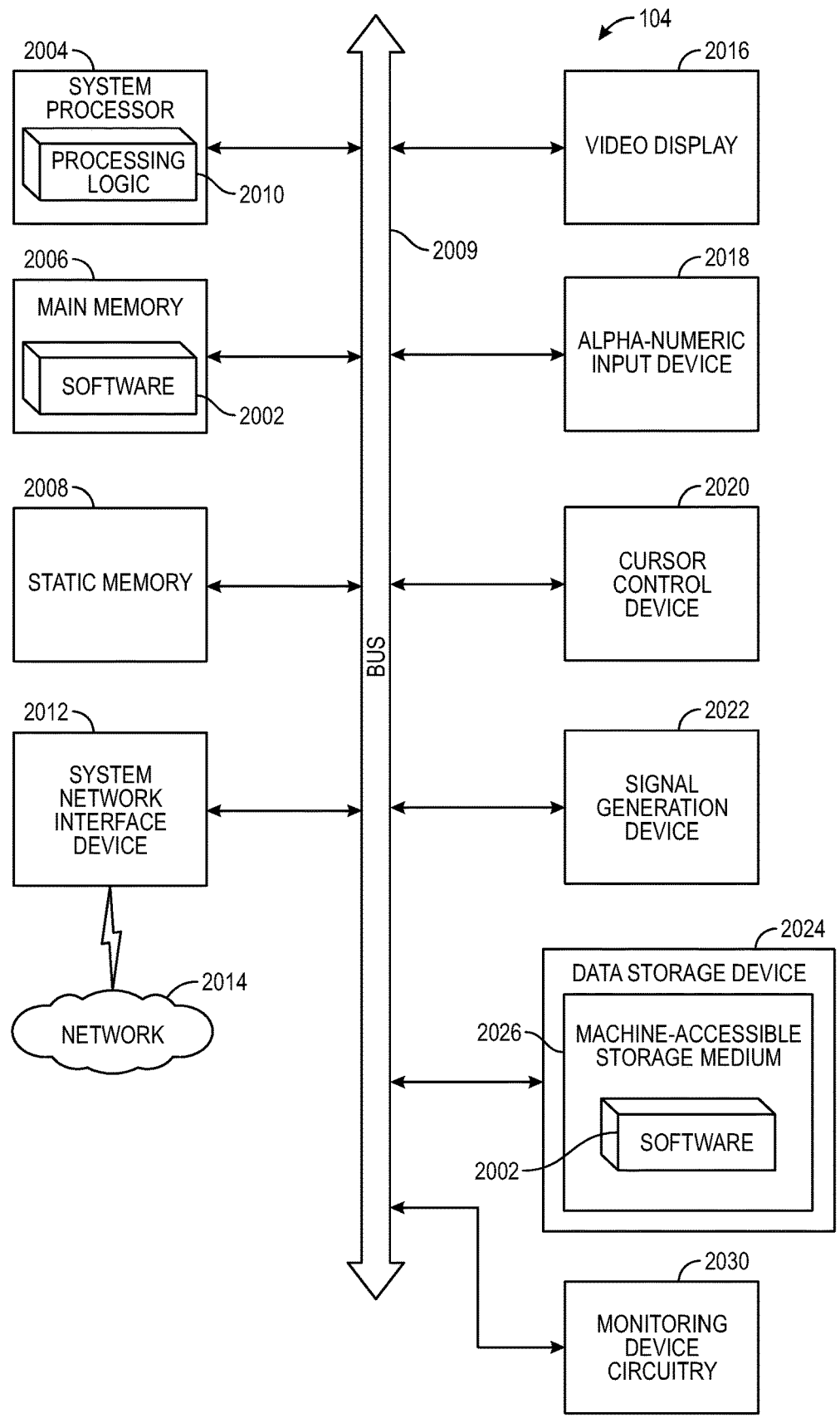
FIG. 20 illustrates a block diagram of an exemplary computer system of a processing system, in accordance with an embodiment.

Referring to FIG. 20, a block diagram of an exemplary computer system of a processing system is shown in accordance with an embodiment. Computer system 104 may be a fabrication facility host computer that is interfaced with electronic circuitry of wafer processing tool 102. In an embodiment, computer system 104 is coupled to and controls robots, load locks 110, process chambers 112, monitoring device 208 and other components of wafer processing tool 102. Computer system 104 may receive and analyze material deposition/removal information provided by sensors 312 as described above.

Computer system 104 may be connected (e.g., networked) to other machines in a Local Area Network (LAN), an intranet, an extranet, or the Internet. Computer system 104 may operate in the capacity of a server or a client machine in a client-server network environment, or as a peer machine in a peer-to-peer (or distributed) network environment. Computer system 104 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 104, the term "machine" shall also be taken to include any collection of machines (e.g., computers) that individually or jointly execute a set (or multiple sets) of instructions to perform any one or more of the methodologies described herein.

Computer system 104 may include a computer program product, or software 2002, having a non-transitory machine-readable medium having stored thereon instructions, which may be used to program computer system 104 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 104 includes a system processor 2004, a main memory 2006 (e.g., read-only memory (ROM), flash memory, dynamic random access memory (DRAM) such as synchronous DRAM (SDRAM) or Rambus DRAM (RDRAM), etc.), a static memory 2008 (e.g., flash memory, static random access memory (SRAM), etc.), and a secondary memory (e.g., a data storage device 2024), which communicate with each other via a bus 2009.

System processor 2004 represents one or more general-purpose processing devices such as a microsystem processor, central processing unit, or the like. More particularly, the system processor 2004 may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 2004 may also be one or more special-purpose processing devices such as an application specific integrated circuit (ASIC), a field programmable gate array (FPGA), a digital signal system processor (DSP), network system processor, or the like. System processor 2004 is configured to execute the processing logic 2010 for performing the operations described herein.

The computer system 104 may further include a system network interface device 2012 for communicating with other devices or machines, e.g., wafer processing tool 102, over a network 2014. The computer system 104 may also include a video display unit 2016 (e.g., a liquid crystal display (LCD), a light emitting diode display (LED), or a cathode ray tube (CRT)), an alphanumeric input device 2018 (e.g., a keyboard), a cursor control device 2020 (e.g., a mouse), and a signal generation device 2022 (e.g., a speaker).

The secondary memory may include a data storage device 2024 having a machine-accessible storage medium 2026 (or more specifically a computer-readable storage medium) on which is stored one or more sets of instructions (e.g., software 2002) embodying any one or more of the methodologies or functions described herein. The software 2002 may also reside, completely or at least partially, within the main memory 2006 and/or within the system processor 2004 during execution thereof by the computer system 104, the main memory 2006 and the system processor 2004 also constituting machine-readable storage media. The software 2002 may further be transmitted or received over a network 2014 via the system network interface device 2012.

While the machine-accessible storage medium 2026 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

System processor 2004 may be placed in electrical connection with monitoring device circuitry 2030 of monitoring device 208. For example, bus 2009 may receive sensor 312 signals through one or more input/output (I/O) connection with system components, e.g., electrical cable 812 and electrical vacuum feedthrough 810. Furthermore, portions of monitoring device circuitry 2030 may be collocated with computer system 104. For example, monitoring device circuitry 2030 may include a frequency source, e.g., a broad frequency source, or a detector. Frequency source and detector may have particular application in relation to specific embodiments of sensors 312 of wafer processing tool 102. For example, the frequency source may output an electrical driving signal to resonator 1802. The detector may receive an output signal from sensor 312 that corresponds to a mass 1804 deposited on sensor surface 512. To detect a shift in the characteristic frequency of resonator 1802, frequency source and detector may be incorporated in computer system 104 of wafer processing tool 102.

The frequency source of monitoring device circuitry may be a broad frequency source that is used to excite resonator 1802. The detector of monitoring device circuitry may monitor the characteristic frequency of resonator 1802, and detect a shift of the characteristic frequency. For example, the detector may output a signal corresponding to the characteristic frequency, e.g., an output voltage or current, to processor 2004. Processor 2004 may be configured to receive the output voltage and recognize the shift of the characteristic frequency. Thus, when a change in the output voltage and/or the characteristic frequency of resonator 1802 is detected, wafer processing tool 102 can note the change as an instance of deposition or removal of material from sensor surface 512 on pad 1812 of resonator 1802. Deposition and removal may be logged over time to detect a rate of deposition and/or removal of material. As mass 1804 of resonator 1802 increases or decreases, e.g., as material accumulates on or evaporates from resonator 1802, the characteristic frequency will shift down, allowing wafer processing tool 102 to monitor and measure a deposition and/or removal rate of a wafer fabrication process in real-time.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A processing tool, comprising:
   a process chamber having a liner wall laterally around a chamber volume, wherein the liner wall includes a hole between the chamber volume and an outer liner surface; and
   a monitoring device including a micro sensor having a sensor surface aligned with the hole along a sensor axis, and a parameter that changes when material is removed from the sensor surface, wherein the micro sensor can be selectively exposed to the chamber volume of the process chamber, wherein the monitoring device detects the parameter that changes when the micro sensor is selectively exposed to the chamber volume of the process chamber, and wherein the monitoring device is configured to alternatingly selectively expose the micro sensor and a blank seal to the chamber volume of the process chamber by rotating both the micro sensor and the blank seal.

2. The processing tool of claim 1, wherein the monitoring device includes an end face having a recess, and wherein the micro sensor is mounted in the recess.

3. The processing tool of claim 2 further comprising a sensor seal mounted on the end face, wherein the sensor seal extends around the recess, and wherein the sensor surface is exposed to the chamber volume through the hole.

4. The processing tool of claim 3 wherein the blank seal is mounted on the end face, wherein the blank seal extends around a blank area of the end face.

5. The processing tool of claim 2 further comprising a pneumatic actuator having a first end coupled to the process chamber and a second end coupled to the monitoring device, wherein the first end is movable relative to the second end to move the end face away from the outer liner surface.

6. The processing tool of claim 1, wherein the micro sensor includes a resonant body having a disc shape, wherein the disc shape includes the sensor surface facing the hole, and a rear sensor surface, and further comprising an electrical vacuum feedthrough electrically connected to the rear sensor surface.

7. The processing tool of claim 6, wherein the monitoring device includes a compressible connector in contact with the rear sensor surface, and wherein the compressible connector is electrically connected to the electrical vacuum feedthrough.

8. The processing tool of claim 7, wherein the compressible connector is a bellows.

9. A monitoring device, comprising:
a device body extending along a central axis, wherein the device body includes an end face orthogonal to the central axis, and wherein the end face includes a recess;
a sensor mounted in the recess, wherein the sensor includes a sensor surface and a parameter that changes when material is removed from the sensor surface;
a sensor seal mounted on the end face, wherein the sensor seal extends around the recess, and wherein the sensor surface is exposed to a surrounding environment through the sensor seal;
a blank seal mounted on the end face, wherein the blank seal extends around a blank area of the end face, wherein a blank axis extends parallel to the central axis and through the blank area, wherein a sensor axis extends parallel to the central axis and through the sensor surface, and wherein the blank axis and the sensor axis are equidistant from the central axis.

10. The monitoring device of claim 9, wherein the sensor includes a resonant body having a disc shape, wherein the disc shape includes the sensor surface facing the surrounding environment and a rear sensor surface, and further comprising an electrical vacuum feedthrough electrically connected to the rear sensor surface.

11. The monitoring device of claim 10, wherein the monitoring device includes a compressible connector in contact with the rear sensor surface, and wherein the compressible connector is electrically connected to the electrical vacuum feedthrough.

12. The monitoring device of claim 11, wherein the compressible connector is a bellows.

13. The monitoring device of claim 9, wherein the device body includes:
a device head having the end face and a head sealing surface extending around the central axis,
a device base having a base sealing surface extending around the central axis, and a body seal between the head sealing surface and the base sealing surface to prevent ingress of gas between the device head and the device base.

14. A method, comprising:
exposing a first region on an end face of a monitoring device to a hole in a liner wall, wherein the liner wall extends laterally around a chamber volume of a processing tool, wherein the first region of the monitoring device comprises a sensor that is exposed to the chamber volume of the processing tool when the first region is exposed to the hole, and wherein the monitoring device detects a parameter that changes on the sensor when the micro sensor is selectively exposed to the chamber volume of the processing tool; and
rotating both the sensor and a blank seal of the monitoring device about a central axis to move the first region away from the hole and to expose the blank seal on the end face to the hole, wherein the sensor of the first end of the monitoring device is not exposed to the chamber volume of the processing tool when the first region is away from the hole.

15. The method of claim 14 further comprising:
loading a wafer of a material into the chamber volume of the processing tool;
initiating a wafer fabrication process in the chamber volume, wherein the material is removed from a sensor surface of the sensor through the hole during the wafer fabrication process; and
detecting a change of a parameter of the sensor in response to removing the material from the sensor surface.

16. The method of claim 15 further comprising determining a rate of removal of the material from the sensor surface based on the change of the parameter.

17. The method of claim 16, wherein the monitoring device includes an end face having a recess, wherein the sensor is mounted in the recess, and further comprising:
exposing the blank seal of the end face to the hole; and
initiating an in-situ chamber cleaning process to clean the liner wall.

18. The method of claim 17, wherein exposing the blank seal of the end face to the hole includes moving the blank seal into alignment with the hole.

19. A method, comprising:
exposing a first region on an end face of a monitoring device to a hole in a liner wall, wherein the liner wall extends around a chamber volume of a processing tool;
rotating the monitoring device about a central axis to move the first region away from the hole and to expose a second region on the end face to the hole;
loading a wafer of a material into a chamber volume of a processing tool, wherein a liner wall extends around the chamber volume, wherein the liner wall includes a hole between the chamber volume and an outer liner surface, wherein a monitoring device includes a sensor having a sensor surface aligned with the hole, and wherein the sensor surface is the first region;
initiating a wafer fabrication process in the chamber volume, wherein the material is removed from the sensor surface through the hole during the wafer fabrication process;
detecting a change of a parameter of the sensor in response to removing the material from the sensor surface;
determining a rate of removal of the material from the sensor surface based on the change of the parameter, wherein the monitoring device includes an end face having a recess, wherein the sensor is mounted in the recess, and the method further comprising:
exposing a blank area of the end face to the hole, wherein the blank area is the second region; and
initiating an in-situ chamber cleaning process to clean the liner wall.

20. The method of claim 19, wherein exposing the blank area of the end face to the hole includes moving the blank area into alignment with the hole.

* * * * *